(12) United States Patent
Ozkan et al.

(10) Patent No.: US 12,270,860 B2
(45) Date of Patent: Apr. 8, 2025

(54) SYSTEMS AND METHODS FOR STATE OF HEALTH ASSESSMENT IN RECHARGEABLE BATTERIES

(71) Applicant: Eatron Technologies Limited, Warwick (GB)

(72) Inventors: Ali Ibrahim Ozkan, Istanbul (TR); Muharrem Ugur Yavas, Istanbul (TR); Can Kurtulus, Istanbul (TR)

(73) Assignee: Eatron Technologies Limited, Warwick (GB)

( * ) Notice: Subject to any disclaimer, the term of this patent is extended or adjusted under 35 U.S.C. 154(b) by 0 days.

(21) Appl. No.: 18/448,522

(22) Filed: Aug. 11, 2023

(65) Prior Publication Data
US 2025/0052820 A1    Feb. 13, 2025

(51) Int. Cl.
*G01R 31/374* (2019.01)
*G01R 31/36* (2020.01)
*G01R 31/367* (2019.01)
*G01R 31/389* (2019.01)
*G01R 31/392* (2019.01)

(52) U.S. Cl.
CPC ....... *G01R 31/374* (2019.01); *G01R 31/3648* (2013.01); *G01R 31/367* (2019.01); *G01R 31/389* (2019.01); *G01R 31/392* (2019.01)

(58) Field of Classification Search
CPC .. G01R 31/374; G01R 31/389; G01R 31/392; G01R 31/367; G01R 31/3648
USPC .......................................................... 702/63
See application file for complete search history.

(56) References Cited

U.S. PATENT DOCUMENTS

| 4,965,738 A * | 10/1990 | Bauer | H01M 10/48 340/636.15 |
| 11,527,786 B1 * | 12/2022 | Budan | G01R 31/396 |
| 11,977,126 B1 * | 5/2024 | Ozkan | G01R 31/367 |
| 12,092,699 B1 * | 9/2024 | Ozkan | G01R 31/3828 |

(Continued)

FOREIGN PATENT DOCUMENTS

| DE | 102012207817 A1 * | 11/2012 | G01R 31/3842 |
| JP | 2016531278 A * | 10/2016 | |

OTHER PUBLICATIONS

English translation of DE 102012207817, Nov. 15, 2012. (Year: 2012).*

(Continued)

*Primary Examiner* — Michael P Nghiem
(74) *Attorney, Agent, or Firm* — Dickinson Wright PLLC; Jonathan H. Harder

(57) ABSTRACT

In one aspect, based on at least a received first state of health of a battery pack and an initial state of charge of the battery pack, a method may include determining, by a state of charge estimator of a digital twin battery model, states of charges for the battery pack. Based on the states of charges for the battery pack, the method may include determining, by a voltage predictor of the digital twin battery model, predicted battery voltages. Based on the predicted battery voltages, the method may include determining, by a state of charge corrector of the digital twin battery model, a voltage difference between the predicted battery voltages and measured voltages. Based on the voltage difference, the method may include correcting, by the state of charge corrector, the states of charges to generate corrected states of charges for the battery pack.

30 Claims, 20 Drawing Sheets

(56) References Cited

U.S. PATENT DOCUMENTS

| | | | | |
|---|---|---|---|---|
| 2017/0356964 | A1* | 12/2017 | Heiries | G01R 31/3842 |
| 2022/0311067 | A1* | 9/2022 | Nedjimi | G01R 31/392 |
| 2023/0160965 | A1* | 5/2023 | Kim | H01M 10/48 |
| | | | | 702/63 |

OTHER PUBLICATIONS

English translation of JP 2016531278, Oct. 6, 2016. (Year: 2016).*

\* cited by examiner

SYSTEMS AND METHODS FOR STATE OF HEALTH ASSESSMENT IN RECHARGEABLE BATTERIES

TECHNICAL FIELD

This disclosure relates generally to assets and batteries. More specifically, this disclosure relates to systems and methods for state of health assessment in rechargeable batteries.

BACKGROUND

Reliance on battery-powered devices and systems continues to increase. For example, such devices and systems range from electric vehicles and renewable energy storage to consumer electronics and wearable computing devices. Determining a battery's state of health (SoH) may provide numerous benefits and/or advantages. However, inaccurate SoH prediction may shorten battery life, which may lead to increased costs and environmental impact. Further, performance may suffer for a device or system powered by a battery affected by an inaccurate SoH prediction.

SUMMARY

In one aspect, a computer-implemented method may include receiving charge cycle data pertaining to a battery pack. The method may include determining, based on the charge cycle data, whether a noise level of a battery management system exceeds a first threshold. In response to determining the noise level exceeds the first threshold, the method may include determining an initial state of charge of the battery pack using coulomb counting by reversing the charge cycle data. In response to determining the noise level does not exceed the first threshold, the method may include determining whether a rest time before charge cycle exceeds a second threshold. In response to determining the rest time before charge cycle does not exceed the second threshold, the method may include determining the initial state of charge of the battery pack using coulomb counting by reversing the charge cycle data.

In one aspect, based on at least a received first state of health of a battery pack and an initial state of charge of the battery pack, a computer-implemented method may include determining, by a state of charge estimator of a digital twin battery model, one or more states of charges for the battery pack. Based on the one or more states of charges for the battery pack, the method may include determining, by a voltage predictor of the digital twin battery model, one or more predicted battery voltages. Based on the one or more predicted battery voltages, the method may include determining, by a state of charge corrector of the digital twin battery model, a voltage difference between the one or more predicted battery voltages and one or more measured voltages. Based on the voltage difference, the method may include correcting, by the state of charge corrector, the one or more states of charges to generate one or more corrected states of charges for the battery pack.

In one aspect, a computer-implemented method may include generating an aging battery dataset including information pertaining to one or more age histories of electric vehicles, one or more cell manufacturer specifications, and one or more laboratory tests. Based on the information and one or more battery health metrics associated with one or more battery pack modules, the method may include predicting a first state of health of the one or more battery pack modules. The method may include receiving a second state of health of the one or more battery pack modules, wherein the second state of health is determined based at least on one or more determined states of charges for the one or more battery pack modules. The method may include determining an uncertainty for the second state of health using at least a rest duration after charging of the one or more battery pack modules and a rest duration before charging of the one or more battery pack modules. Based on the uncertainty, the first state of health, and the second state of health, the method may include determining a confidence score for the second state of health of the one or more battery pack modules.

In another aspect, one or more tangible, non-transitory computer-readable media may store instructions and one or more processing devices may execute the instructions to perform one or more operations of any method disclosed herein.

In another aspect, a method may include one or more operations implemented by computer instructions and performed by one or more processing devices to perform the techniques disclosed herein.

In another aspect, a system may include one or more memory devices storing instructions and one or more processing devices communicatively coupled to the one or more memory devices. The one or more processing devices may execute the instructions to perform the techniques disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication. The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

A battery cell may refer to most basic unit of a battery. A battery cell may include an anode, cathode, and electrolyte. These components may allow for the movement of ions, creating an electric charge. Battery cells are often combined into larger structures to enable storing enough energy to power certain devices and/or systems.

Battery modules may be made up of multiple interconnected cells. The cells within a module may be connected in different ways (series, parallel, or in combination) to achieve a desired electrical output. Series connections increase voltage, while parallel connections increase capacity (measured in Ampere-hours, Ah). The exact configuration can vary depending on the specific requirements of an application.

A battery pack is made up of numerous modules and may include additional components to manage and protect the battery system.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

Detecting battery faults early may allow for timely battery pack or cell maintenance, repair, and/or replacement. Such maintenance, repair, and/or replacement may enable continued device functionality. Conventional detection methods may be categorized in two ways: model-based approaches and data-based approaches. Each method has its shortcomings. For example, some model-based approaches are hindered by imprecise sensors used in conventional battery management systems, which leads to inaccurate state of charge estimation. Further, data-based methods overlook real-world battery usage patterns and fail to accurately predict state of charge and/or state of health of a battery.

Accordingly, some embodiments of the present disclosure provide determining the state of health and a confidence score for each of battery cells, battery modules, and/or battery packs. The techniques may use battery data obtained from one or more sensors associated with a battery powering a computing device, asset, electric vehicle, or the like. As disclosed further herein, some embodiments use a cloud-based system to perform digital twin battery modeling to enhance the accuracy of the state of health of a battery. Also, in some embodiments, fleet level data may be used and compared in an aging dataset. The fleet level data may include characteristics of similar vehicles including their current, voltage, temperature, etc. and associated state of charge and/or state of health, among other things. As a result, better management and maintenance of the battery may be provided, which may improve reliability and extend the life of the battery. Further, the disclosed techniques may reduce overall costs associated with rechargeable batteries and may reduce environmental impact of using rechargeable batteries.

The disclosed techniques may be leveraged in any suitable industry that uses batteries, such as electric vehicles, consumer electronics, renewable energy storage, aerospace, telecommunications, and personal devices like laptops, smartphones, electronic watches, rings, and other wearable computing devices. The techniques may be used with different types of battery technologies, such as lithium batteries and solid state batteries.

A battery pack may include cells arranged in modules. Some embodiments of the present disclosure may enable determining a state of health at the cell level, the module level, and/or the pack level. Accordingly, once a fault is detected at the cell and/or module level, some embodiments of the present disclosure may enable performing granular preventative actions, such as replacing a cell and/or module, repairing a cell and/or module, and the like.

FIGS. 1 through 20, discussed below, and the various embodiments used to describe the principles of this disclosure are by way of illustration only and should not be construed in any way to limit the scope of the disclosure.

Figure 1:
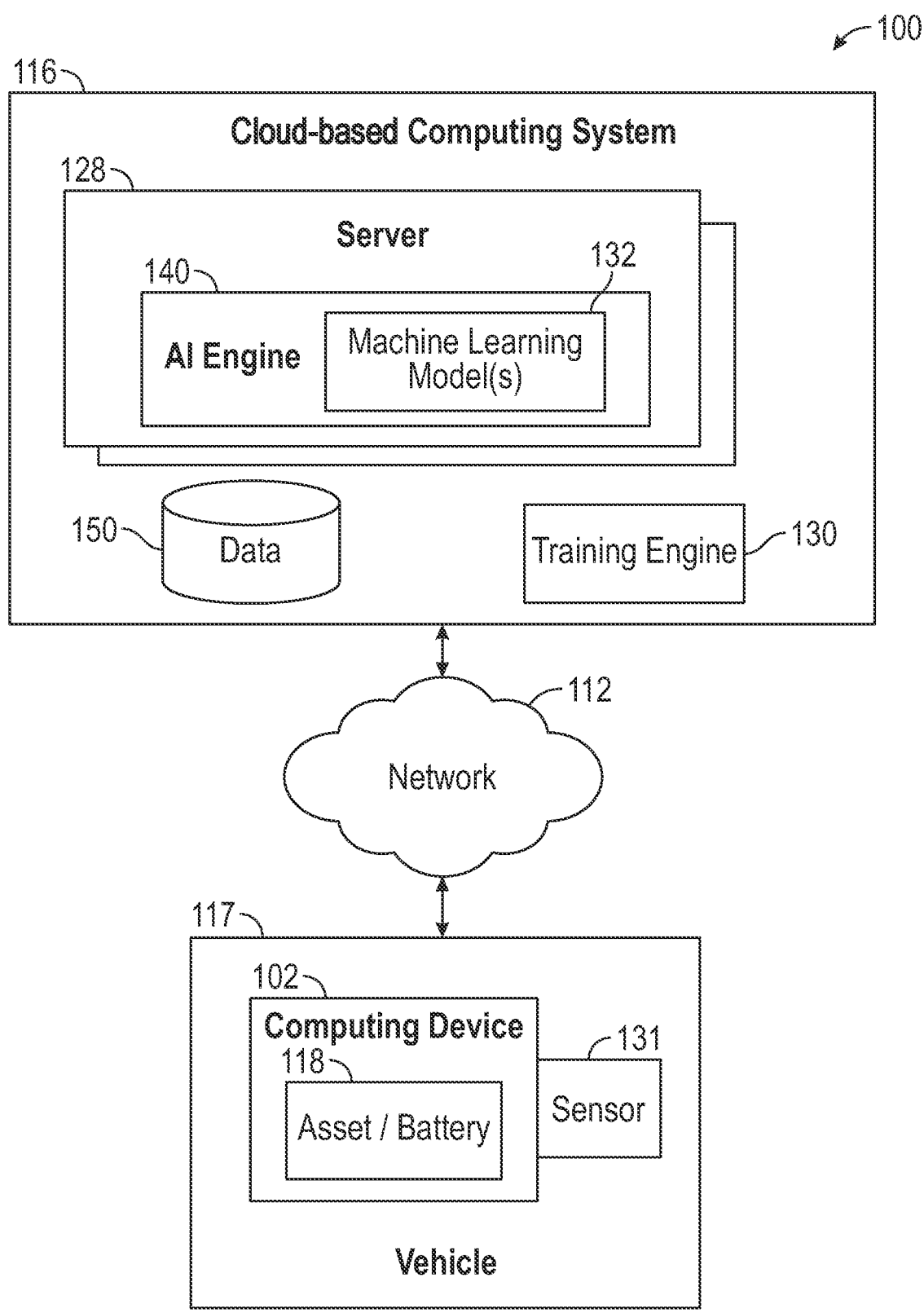
FIG. 1 illustrates a high-level component diagram of an illustrative system architecture according to certain embodiments of this disclosure.

FIG. 1 illustrates a high-level component diagram of an illustrative system architecture 100 according to certain embodiments of this disclosure. In some embodiments, the system architecture 100 may include a cloud-based computing system 116, a computing device 102, and a vehicle 117 communicatively coupled via a network 112. The cloud-based computing system 116 may be a real-time software platform, include privacy software or protocols, or include security software or protocols. Each of the computing device 102 and components included in the cloud-based computing system 116 may include one or more processing devices, memory devices, or network interface cards. The network interface cards may enable communication via a wireless protocol for transmitting data over short distances, such as Bluetooth, ZigBee, NFC, etc. Additionally, the network interface cards may enable communicating data via a wired protocol over short or long distances, and in one example, the computing device 102 and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IoT).

The computing device 102 may be any suitable computing device, such as an embedded computer device with display, a laptop, tablet, smartphone, or computer. The computing device 102 may be included within a vehicle, such as an electric vehicle. The computing device 102 may include a display capable of presenting a user interface of an application. The application may be implemented in computer instructions stored on the one or more memory devices of the computing device 102 and executable by the one or more processing devices of the computing device 102. The computing device 102 may include an asset and/or battery pack 118, each of which may have a useful life that degrades over time. The asset and/or battery pack 118 may be used to charge and power a vehicle (e.g., electric vehicle), smartphone, appliance, or any suitable device that uses a battery. The asset and/or battery pack 118 may be separate from the computing device 102 within the vehicle 117. The asset and/or battery pack 118 may be communicatively coupled to the computing device 102 and one or more devices of the vehicle 117.

The user interface may present various screens to a user that present various views including notifications of a state of health of one or more battery cells, battery modules, and/or battery packs. The user interface may enable performing a preventive action such as presenting a signal (e.g., warning signal that the state of health is degrading) and/or changing an operating parameter of the vehicle (e.g., consume less energy from the battery, stop using one or more cells of the battery pack, etc.), and the like. The computing device 102 may also include instructions stored on the one or more memory devices that, when executed by the one or more processing devices of the computing device 102, perform operations of any of the methods described herein.

The vehicle 117 may be any suitable type of vehicle or electric vehicle, such as an automobile, a motorcycle, a boat, an airplane, a bicycle, a scooter, a skateboard, roller skates, roller blades, a unicycle, a surfboard, a drone, or the like. Accordingly, the vehicle 117 may include an engine that is powered by one or more batteries, assets, and motors. The vehicle 117 may also include one or more sensors 131 that are configured to measure any suitable parameter of a vehicle (e.g., a temperature of the vehicle 117, a vibration of the vehicle 117, etc.), a battery cell (e.g., a battery cell voltage, a battery cell temperature, a battery cell current, a battery cell capacitance, a battery cell resistance, etc.), a battery module (e.g., a battery module voltage, a battery module current, a battery module temperature, a battery module capacitance, a battery module resistance, etc.), a battery pack (e.g., a battery pack voltage, a battery pack current, a battery pack temperature, a battery pack capacitance, a battery pack resistance, etc.), and the like. The sensors 131 may include an accelerometer, a current sensor, a voltage sensor, a temperature sensor, a thermal sensor, a camera, a capacitance sensor, a resistance sensor, or the like. The processing device of the vehicle 117 may receive the measurements from the one or more sensors 131 and transmit them via the network 112 to the cloud-based computing system 116 for use in determining at least a state of health of the vehicle 117. To that end, the computing device 102 of the vehicle 117 may operate a battery management system configured to use telemetry to transmit the measured sensor data to the cloud-based computing system 116.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The memory devices of the servers 128 may store instructions implementing one or more software applications that, when executed by one or more processing devices of the servers 128, perform the techniques and methodologies described herein.

The servers 128 may execute an artificial intelligence engine 140 and one or more machine learning models 132. That is, the servers 128 may execute an artificial intelligence (AI) engine 140 that uses one or more machine learning models 132 to perform at least one of the embodiments disclosed herein. The cloud-based computing system 116 may also include a database 150 that stores data, knowledge, and data structures used to perform various embodiments. For example, the database 150 may store fleet of electric vehicles' data, battery data (e.g., cell voltage measurements, cell temperature measurements, z-scores, etc.) received from a manufacturer of the battery, lab experiment data pertaining to the battery, user battery usage profile, etc. Although depicted separately from the server 128, in some embodiments, the database 150 may be hosted on one or more of the servers 128.

In some embodiments, the cloud-based computing system 116 may include a training engine 130 capable of generating one or more machine learning models 132. Although depicted separately from the AI engine 140, the training engine 130 may, in some embodiments, be included in the AI engine 140 executing on the server 128. In some embodiments, the AI engine 140 may use the training engine 130 to generate the machine learning models 132 trained to perform inferencing and/or predicting operations. The machine learning models 132 may be trained to predict state of health of a battery, among other things. The one or more machine learning models 132 may be generated by the training engine 130 and may be implemented in computer instructions executable by one or more processing devices of the training engine 130 or the servers 128. To generate the one or more machine learning models 132, the training engine 130 may train the one or more machine learning models 132. The one or more machine learning models 132 may be used by any of the methods described herein.

The training engine 130 may be a rackmount server, a router, a personal computer, a portable digital assistant, a smartphone, a laptop computer, a tablet computer, a netbook, a desktop computer, an Internet of Things (IoT) device, any other desired computing device, or any combination of the above. The training engine 130 may be cloud-based, be a real-time software platform, include privacy software or protocols, or include security software or protocols.

To generate the one or more machine learning models 132, the training engine 130 may train the one or more machine learning models 132. The training engine 130 may use a base training data set including inputs of labeled data (e.g., assigned a value of 1) associated with desired state of health (e.g., high remaining useful life, high capacity, fast charge rate, etc.) and labeled data (e.g., assigned a value of 0) associated with an undesirable state of health, among other things.

The one or more machine learning models 132 may refer to model artifacts created by the training engine 130 using training data that includes training inputs and corresponding target outputs. The training engine 130 may find patterns in the training data wherein such patterns map the training input to the target output and generate the machine learning models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more machine learning models 132 may comprise, e.g., a single level of linear or non-linear operations (e.g., a support vector machine (SVM) or the machine learning models 132 may be a deep network, i.e., a machine learning model comprising multiple levels of non-linear operations. Examples of deep networks are neural networks, including generative adversarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons. In some embodiments, the one or more machine learning models 132 may be trained via supervised learning, unsupervised learning, and/or reinforcement learning.

Figure 2:
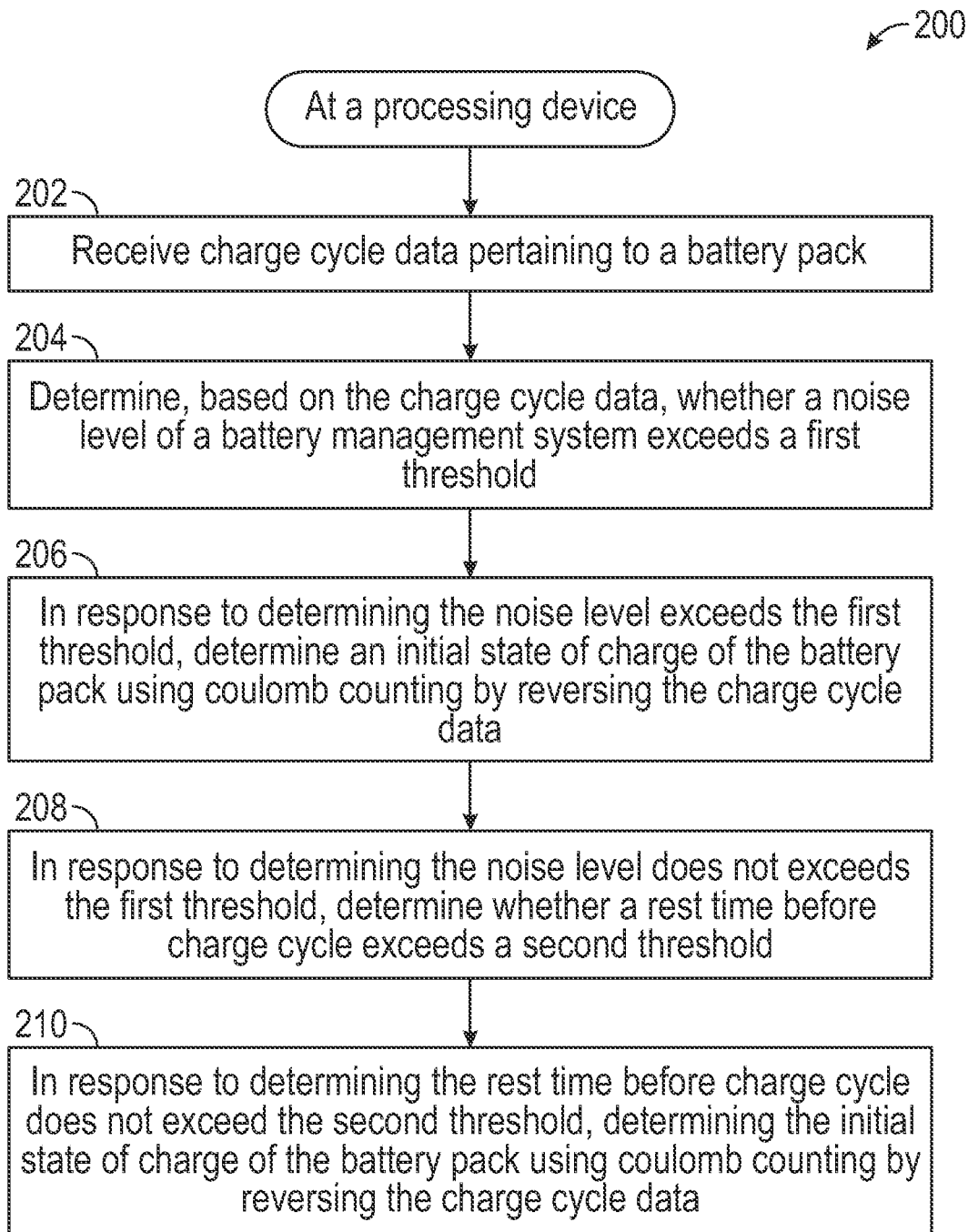
FIG. 2 illustrates example operations of a method for using thresholds to determine an initial state of charge of a battery pack by reversing charge cycle data according to certain embodiments of this disclosure.

FIG. 2 illustrates example operations of a method 200 for using thresholds to determine an initial state of charge of a battery pack by reversing charge cycle data according to certain embodiments of this disclosure. The method 200 is performed by processing logic that may include hardware (circuitry, dedicated logic, etc.), software (such as is run on a computer system or specialized dedicated machine), or a combination of both. The method 200 or each of their individual functions, routines, subroutines, or operations may be performed by one or more processors of a computing device (e.g., any component of FIG. 1, such as computing device 102, server 128, etc.). In certain implementations, the method 200 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 200 is depicted and described as a series of operations. However, operations in accordance with this disclosure can occur in various orders or concurrently, and with other operations not presented and described herein. For example, the operations depicted in the method 200 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or events.

At 202, the processing device may receive charge cycle data pertaining to a battery pack. In some embodiments, the charge cycle data be received from one or more sensors 131 associated with a battery pack located at a vehicle 117. The charge cycle data may include current, voltage, temperature, state of charge, charging rates, discharging rates, or some combination thereof. In some embodiments, the charge cycle data may identify a start and end of one or more charge events for the battery pack, a duration of the one or more charge events, a rest duration of before and after the one or more charge events, or some combination thereof.

In some embodiments, the battery pack may be used to at least partially power a vehicle, a computing device, or both. In some embodiments, the one or more measurements may be received while the battery pack before a charging event, during a charging, or after a charging event.

At 204, the processing device may determine, based on the charge cycle data, whether a noise level of a battery management system exceeds a first threshold. The battery management system may be operated by a computing device of the vehicle 117.

At 206, in response to determining the noise level exceeds the first threshold, the processing device may determine an initial state of charge of the battery pack using coulomb counting by reversing the charge cycle data. In some embodiments, as described further herein, reversing the charge cycle data may include using a longer rest duration following a charge cycle, as opposed to a shorter rest duration preceding a charge cycle, to determine the initial state of charge.

At 208, in response to determining the noise level does not exceed the first threshold, the processing device may determine whether a rest time before charge cycle exceeds a second threshold.

At 210, in response to determining the rest time before charge cycle does not exceed the second threshold, the processing device may determine the initial state of charge of the battery pack using coulomb counting by reversing the charge cycle data. In response to determining the rest time before charge cycle exceeds the second threshold, the processing device may determine the initial state of charge of the battery pack by using a state of charge-open circuit voltage table.

In some embodiments, based on the charge cycle data and the initial state of charge, the processing device may simulate a charging cycle using a digital twin battery model. In some embodiments, based on the simulated charging cycle, the processing device may determine a state of health of the battery pack. In some embodiments, the state of health may be represented as a numerical value, a status, a color-coded graphical element, or the like. The state of health may indicate a healthy battery (e.g., high remaining useful life, high capacity, fast charging rate, etc.) or an unhealthy battery (e.g., low remaining useful life, low capacity, slow charging rate, etc.). In some embodiments, based on the simulated charging cycle and an aging dataset, the processing device may determine a confidence score for the state of health of the battery pack. In some embodiments, the aging dataset may be generated to include parameters including at least one of a number of charge cycles, an average charge rate, an average discharge rate, a total rest period, an average state of charge during rest, or some combination thereof.

In some embodiments, the battery pack may include a set of cells and the one or more measurements may be received for each of the set of cells. The processing device may compare the one or more measurements for each of the set of cells.

In some embodiments, the processing device may transmit the one or more measurements to the cloud-based computing system 116, which may use the one or more measurements to train one or more cloud-based machine learning models 132 configured to predict the fault condition.

Figure 3:
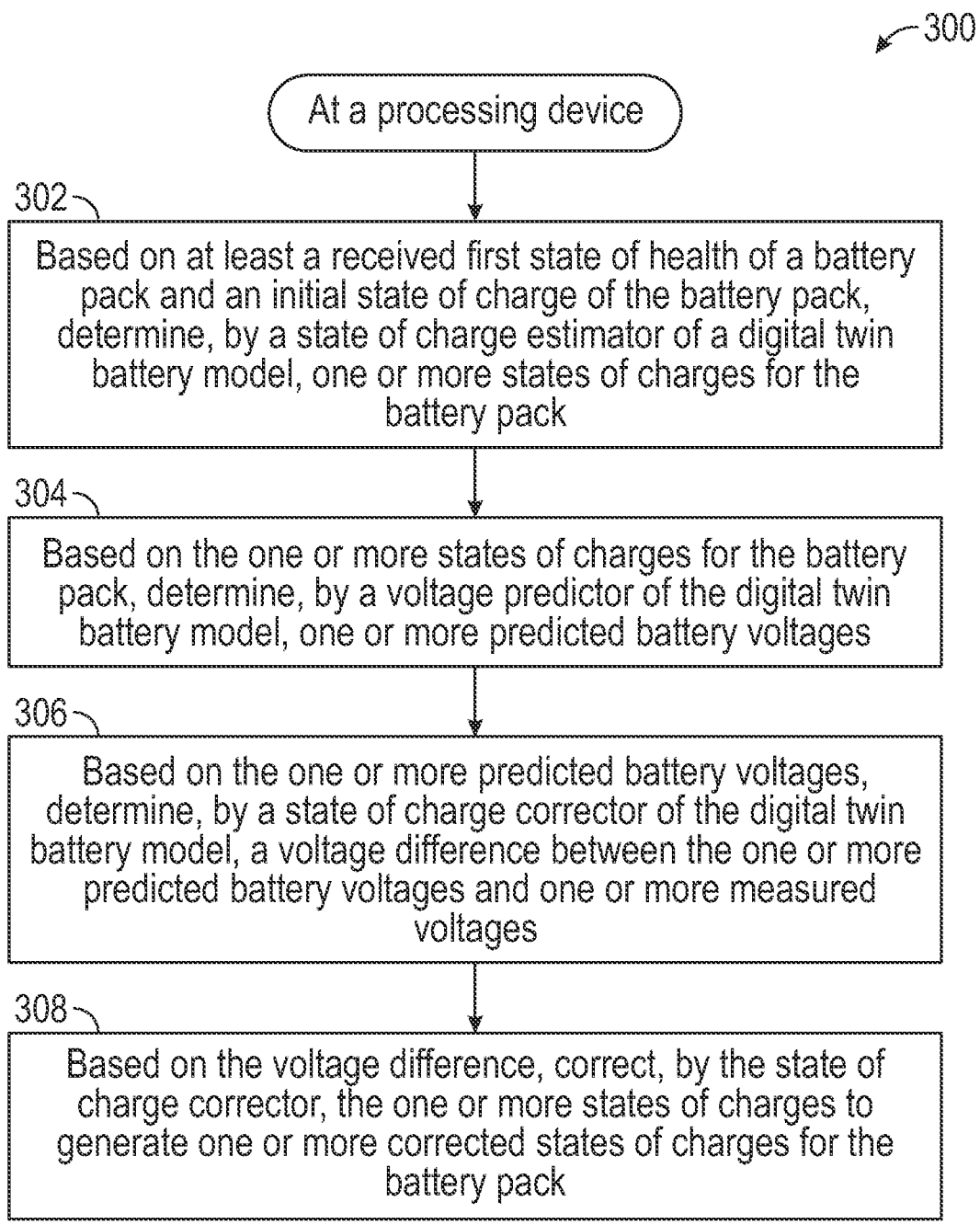
FIG. 3 illustrates example operations of a method for using a digital twin battery model to correct one or more states of charges for a battery pack according to certain embodiments of this disclosure.

FIG. 3 illustrates example operations of a method 300 for using a digital twin battery model to correct one or more states of charges for a battery pack according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as computing device 102, server 128, etc.). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 300 is depicted and described as a series of operations. However, operations in accordance with this disclosure can occur in various orders or concurrently, and with other operations not presented and described herein. For example, the operations depicted in the method 300 may occur in combination with any other operation of any other method disclosed herein. Furthermore, not all illustrated operations may be required to implement the method 300 in accordance with the disclosed subject matter. In addition, those skilled in the art will understand and appreciate that the method 300 could alternatively be represented as a series of interrelated states via a state diagram or events.

At 302, based on at least a received first state of health of a battery pack and an initial state of charge of the battery pack, the processing device may determine, by a state of charge estimator of a digital twin battery model, one or more states of charges for the battery pack. In some embodiments, the digital twin battery model may be executed by the cloud-based computing system 116, such as via server 128.

At 304, based on the one or more states of charges for the battery pack, the processing device may determine, by a voltage predictor of the digital twin battery model, one or more predicted battery voltages. In some embodiments, to determine the one or more predicted battery voltages, the voltage predictor further uses resistance and capacitance parameters of the battery pack, a measured current of the battery pack, and a state of charge-open circuit voltage curve.

At 306, based on the one or more predicted battery voltages, the processing device may determine, by a state of charge corrector of the digital twin battery model, a voltage difference between the one or more predicted battery voltages and one or more measured voltages.

At 308, based on the voltage difference, the processing device may correct, by the state of charge corrector, the one or more states of charges to generate one or more corrected states of charges for the battery pack. In some embodiments, the processing device may determine, by the state of charge corrector, an accumulation of Ampere-hours based on current flow and a time duration of the current flow. In some embodiments, based on the accumulation of Ampere-hours and the one or more corrected state of charges for the battery pack, the processing device may determine a second state of health of the battery pack.

In some embodiments, the processing device may determine, by the state of charge corrector, a rest duration before charging cycle as a time interval between an end of discharging the battery pack and a start of charging the battery pack. In some embodiments, the processing device may determine, by the state of charge corrector, a rest duration after charging cycle as a time interval between an end of charging the battery pack and a time when the battery pack is subsequently used.

Figure 4:
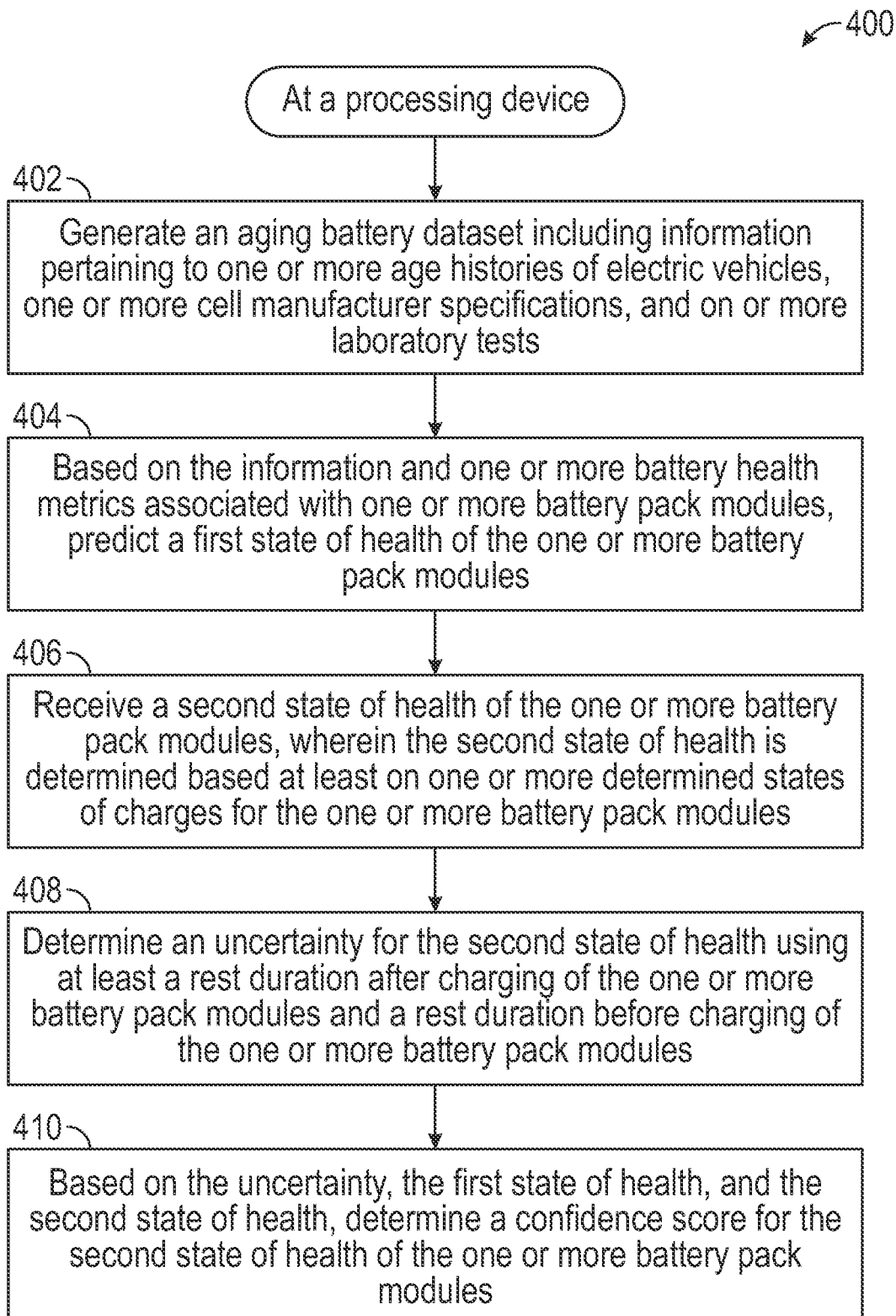
FIG. 4 illustrates example operations of a method for generating a confidence score for a determined state of health of one or more battery pack modules according to certain embodiments of this disclosure.

FIG. 4 illustrates example operations of a method 400 for generating a confidence score for a determined state of health of one or more battery pack modules according to certain embodiments of this disclosure. The method 400 is performed by processing logic that may include hardware (circuitry, dedicated logic, etc.), software (such as is run on a computer system or specialized dedicated machine), or a combination of both. The method 400 or each of their individual functions, routines, subroutines, or operations may be performed by one or more processors of a computing device (e.g., any component of FIG. 1, such as computing device 102, server 128, etc.). In certain implementations, the method 400 may be performed by a single processing thread. Alternatively, the method 400 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 400 is depicted and described as a series of operations. However, operations in accordance with this disclosure can occur in various orders or concurrently, and with other operations not presented and described herein. For example, the operations depicted in the method 400 may occur in combination with any other operation of any other method disclosed herein. Furthermore, not all illustrated operations may be required to implement the method 400 in accordance with the disclosed subject matter. In addition, those skilled in the art will understand and appreciate that the method 400 could alternatively be represented as a series of interrelated states via a state diagram or events.

At 402, the processing device may generate an aging battery dataset including information pertaining to one or more age histories of a fleet of electric vehicles, one or more cell manufacturer specifications, and one or more laboratory tests. In some embodiments, the one or more laboratory tests may include cyclic aging tests and calendar aging tests that subject battery cells to controlled conditions of temperature, humidity, and cycling to simulate an aging process. In some embodiments, the one or more cell manufacturer specifications may include a nominal capacity of one or more battery cells, a nominal voltage of the one or more battery cells, or some combination thereof.

At 404, based on the information and one or more battery health metrics associated with one or more battery pack modules, the processing device may predict a first state of health of the one or more battery pack modules. In some embodiments, the first state of health of the one or more battery pack modules may be predicted based on a number of charge cycles, an average discharge rate, an average charge rate, a rest period duration, and an average state of charge value during rest period of the electric vehicles.

At 406, the processing device may receive a second state of health of the one or more battery pack modules, wherein the second state of health is determined based at least on one or more determined states of charges for the one or more battery pack modules. In some embodiments, the second state of health of the one or more battery pack modules may be further determined based on a voltage difference between one or more predicted battery voltages and one or more measured voltages of the one or more battery pack modules. In some embodiments, the second state of health of the one or more battery pack modules may be further determined based on an Ampere-hours accumulated value.

At 408, the processing device may determine an uncertainty for the second state of health using at least a rest duration after charging of the one or more battery pack modules and a rest duration before charging of the one or more battery pack modules.

At 410, based on the uncertainty, the first state of health, and the second state of health, the processing device may determine a confidence score for the second state of health of the one or more battery pack modules. In some embodiments, based on the confidence score of the state of health of the one or more battery pack modules, the processing device may manage one or more parameters of the one or more battery pack modules. For example, the processing device may cause the battery pack module to power off.

Figure 5:
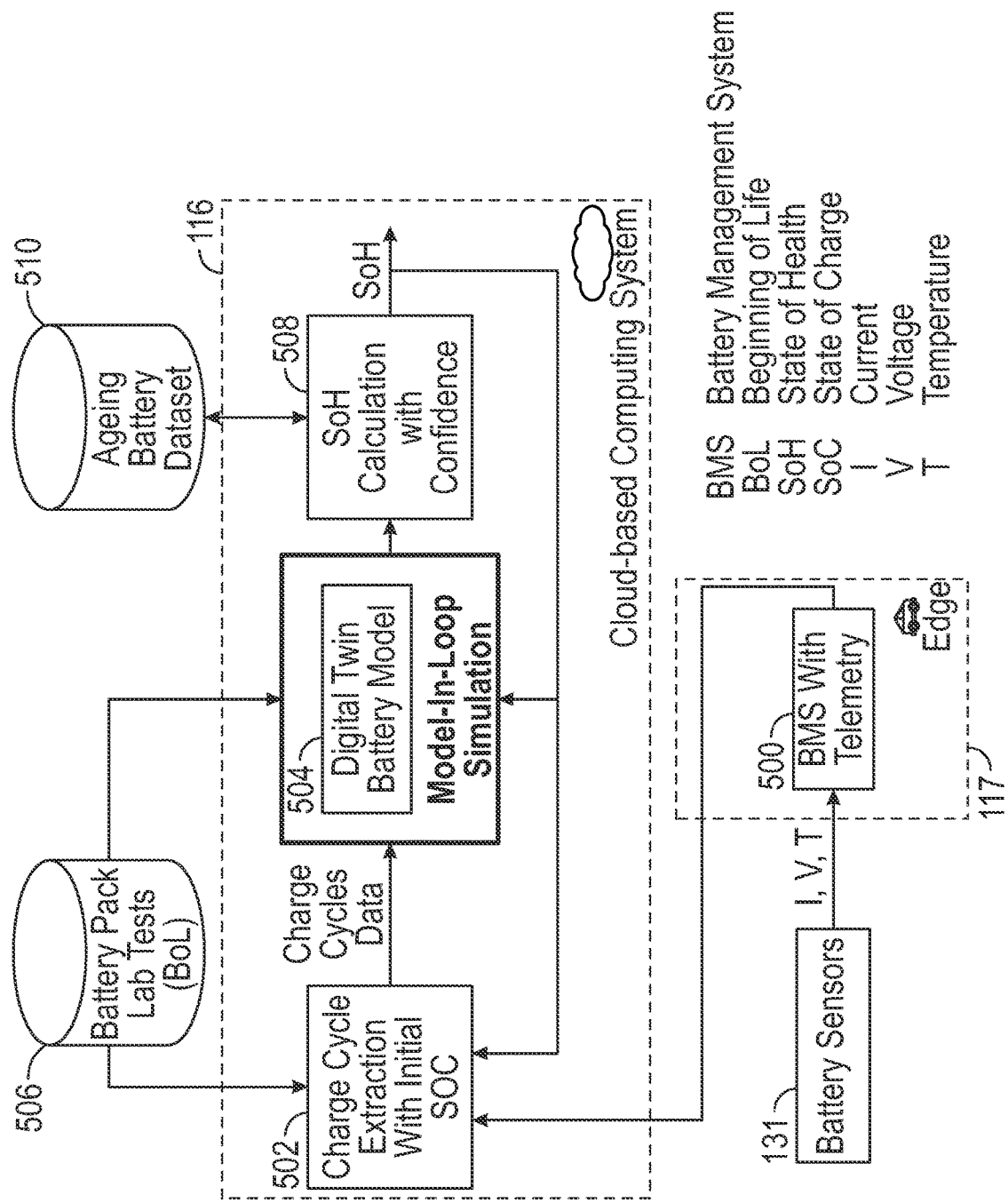
FIG. 5 illustrates an example conceptual block diagram for determining a state of health of a battery pack at a cloud-based system based on data received from a vehicle according to certain embodiments of this disclosure.

FIG. 5 illustrates an example conceptual block diagram for determining a state of health of a battery pack at a cloud-based computing system 116 based on data received from a vehicle 117 according to certain embodiments of this disclosure. The vehicle 117 may be referred to as the "edge" interchangeably herein. It should be noted that other devices may be "edge" devices (e.g., laptops, tablets, mobile phones, appliances, engines, etc.) and the disclosure is not limited to just vehicles. The sensors 131 perform measurements, such as current, voltage, and temperature, of a battery pack and/or asset. The sensors 131 may transmit the measurements to a battery management system (BMS) 500 that includes telemetry. The BMS 500 may transmit the measurements to the cloud-based computing system 116 that executes instructions (502) for charge cycle extraction to enable performing initial state of charge determination. Executing the instructions may generate charge cycle data. The charge cycle extraction may use information from battery pack laboratory tests 506 to generate the charge cycle data. The battery pack laboratory tests 506 may include certain beginning of life tests for the battery pack.

The charge cycle data may be transmitted for model-in-loop simulation using a digital twin battery model 504. The model-in-loop simulation may simulate data to re-estimate state of charge of a battery pack and state of health of the battery pack. Such techniques may enhance accuracy of BMS calculations (e.g., state of charge and/or state of health) and enhance performance and/or safety of vehicles that include noisy sensors and/or BMS. The digital twin battery model 504 may be implemented in computer instructions stored on one or more memory devices of the cloud-based computing system 116 (such as on the server 128) and executed by one or more processing devices of the cloud-based computing system 116. The digital twin battery model 504 may determine various information, such as corrected states of charges for one or more battery pack cells, battery pack modules, and/or battery packs. The digital twin battery model 504 may use information from the battery pack laboratory tests 506 to determine the corrected states of charges. The cloud-based computing system 116 may execute instructions (506) that determine a state of health of the battery pack using at least the corrected states of charges from the digital twin battery model 504. The instructions 506 may use an aging battery dataset 510 to determine the state of health of the battery pack. The instructions 506 may also determine a confidence score for the state of health of the battery pack. The state of health and the confidence score may be used to perform one or more actions, such as controlling operation of the battery pack (e.g., powering on/off, charging, etc.). Such techniques may enable optimizing performance of the battery pack, extending the life of the battery pack, etc.

Figure 6:
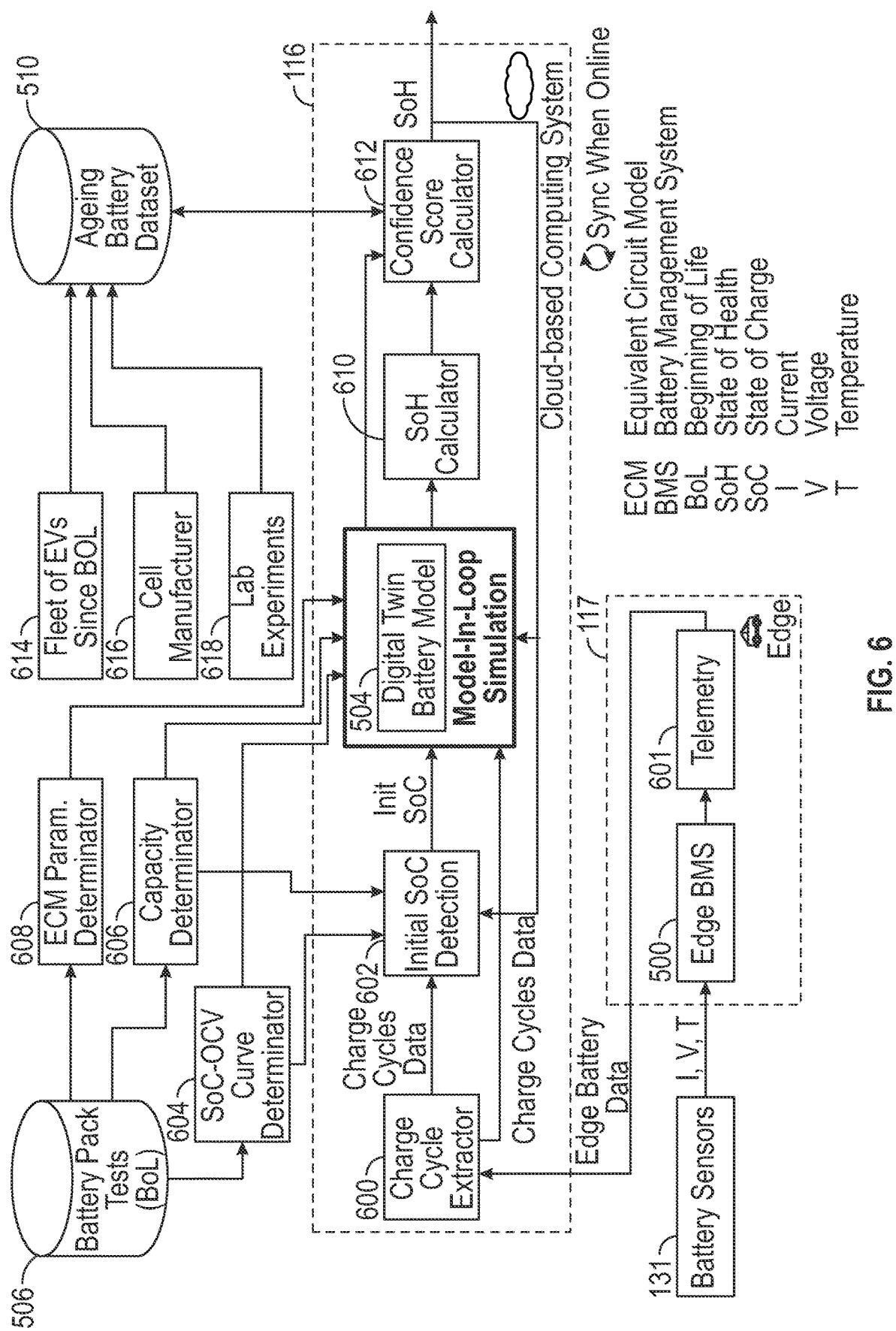
FIG. 6 illustrates an example detailed block diagram for determining a state of health of a battery pack at a cloud-based system based on data received from a vehicle according to certain embodiments of this disclosure.

FIG. 6 illustrates an example detailed block diagram for determining a state of health of a battery pack at a cloud-based computing system 116 based on data received from a vehicle 117 according to certain embodiments of this disclosure. As depicted, edge battery data is obtained from the edge BMS 500 via telemetry 601. The edge battery data may include at least data measured by sensors 131, such as voltage, current, and temperature measurements of the battery pack during a charging process. In some embodiments, a charging event (charge cycle data) of the battery pack is extracted from the edge (e.g., vehicle 117) using a charge cycle extractor 600, which may be implemented in instructions stored on one or more memory devices and executed by one or more processing devices of the cloud-based computing system 116. The cloud-based computing system 116 may execute instructions (602) to perform initial state of charge detection and/or determination, as described further herein. The instructions 602 may use the charge cycle data, as well as information received from a state of charge-open circuit voltage determinator 604 and a capacity determinator 606. In some embodiments, the instructions 602 may also use a state of health determined using the disclosed techniques and fed back via a closed-loop feedback mechanism.

The determined initial state of charge may be used for model-in-loop simulation by being input into the digital twin battery model 504. Further, the digital twin battery model 504 may use the charge cycle data, the determined state of health, and information received from the state of charge-open circuit voltage determinator 604, the capacity determinator 606, and an equivalent circuit model determinator 608. The digital twin battery model 504 may use the initial state of charge and other input information (e.g., charging voltage/current data) to simulate the charging event of the battery pack in the cloud-based computing system 116. The digital twin battery model 504 may provide an accurate representation of the battery's behavior during the charging process.

The cloud-based computing system 116 may execute instructions implementing a state of health calculator 610 to determine the state of health of the battery pack based on estimated or corrected states of charges and accumulated currents obtained from the simulation of the digital twin battery model 504. A confidence score calculator 612 implemented in instructions stored on one or more memory devices and executed by one or more processing devices of the cloud-based computing system 116 may determine a confidence score for the state of health. The confidence score calculator 612 may receive information from an aging battery dataset 510, such as information pertaining to a fleet of electric vehicles 614, battery cell manufacturer specifications 616, and/or laboratory tests 618. The confidence score may represent a degree of certainty for the determined state of health.

Figure 7:
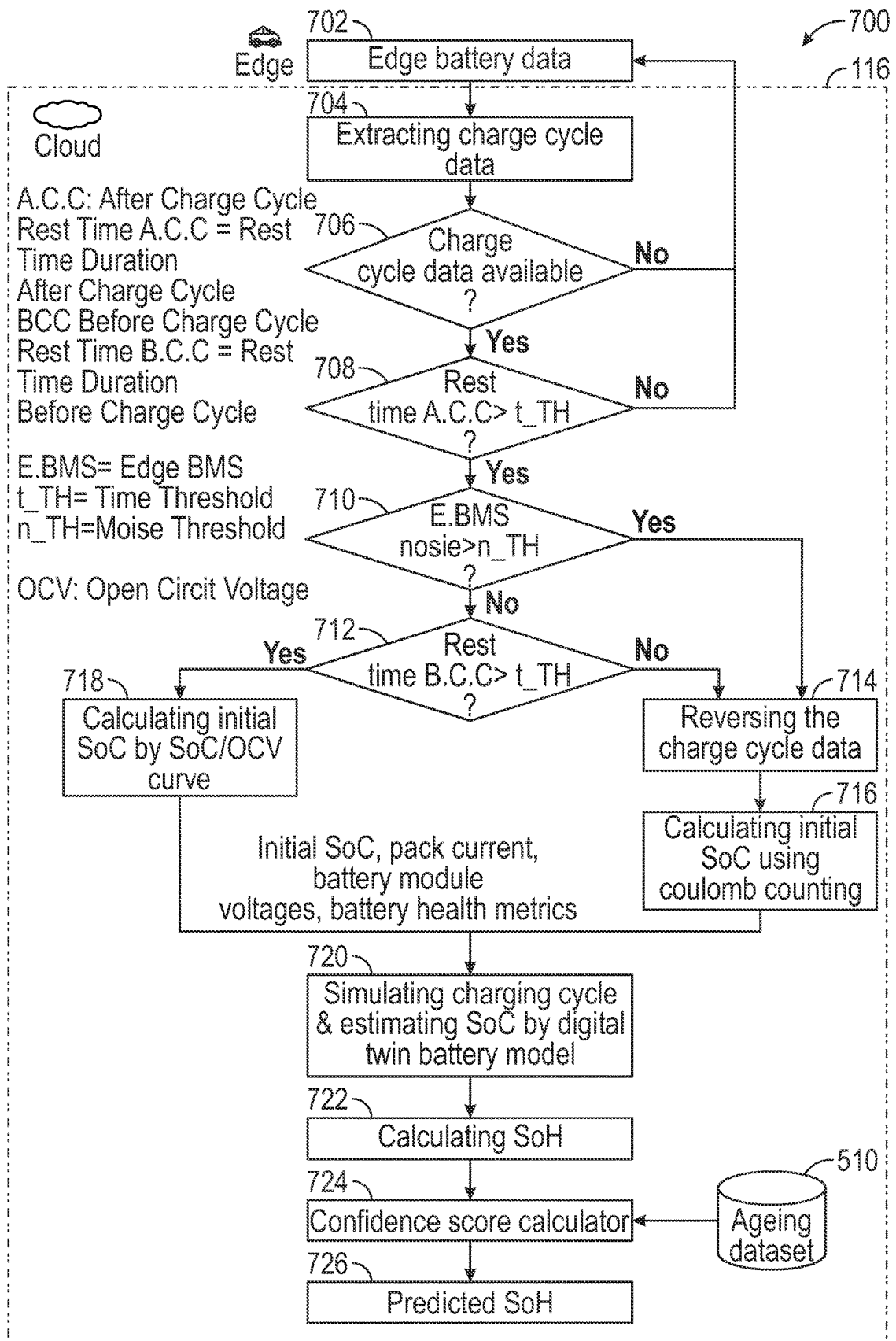
FIG. 7 illustrates an example flow diagram for determining a state of health of a battery pack at a cloud-based system based on data received from a vehicle according to certain embodiments of this disclosure.

FIG. 7 illustrates an example flow diagram 700 for determining a state of health of a battery pack at a cloud-based computing system 116 based on data received from a vehicle 117 according to certain embodiments of this disclosure. Various steps in the flow diagram 700 may be implemented in instructions stored on one or more memory devices and executed by one or more processing devices of the cloud-based computing system 116 (e.g., such as server 128). The flow diagram 700 begins at 702, where edge battery data is obtained from the edge device (e.g., vehicle 117) and transmitted to the cloud-based computing system 116. The edge battery data may include parameters such as voltage, current, temperature, etc.

It should be noted that rest time before charge cycle (rest time B.C.C.) refers to the period of inactivity that precedes the charging process. The rest time after charge cycle (A.C.C.) refers to the inactivity period that occurs following the charging process. Rest time before charge cycle and rest time after charge cycle refer to the duration of these inactivity periods. Both parameters play a role in state of health determination, as described further herein.

Steps 704-726 may be performed by one or more processing devices of the cloud-based computing system 116. At 704, the processing device may extract charge cycle data. This step may identify and segment the charging cycles in the charge cycle data. At 706, the processing device may determine whether charging cycle data is available. If there is no charge cycle data available, the flow diagram 700 returns to collecting more edge battery data. If there is charge cycle data available, the flow diagram 700 proceeds to 708 to determine whether a rest time after charging (rest time A.C.C.) exceeds a predefined threshold (t_TH). If it does not exceed the threshold, then the flow diagram 700 returns to collecting more edge battery data. If it exceeds the threshold, then the flow diagram 700 proceeds to determine whether the edge battery management system (E.BMS) noise (e.g., fluctuations in voltage and/or current) exceeds a predefined threshold (n_TH). If the noise is higher than n_TH, then the processing device reverses the charge cycle data at 714 and determines the initial state of charge using coulomb counting with the reversed charge cycle data at 716. That is, after reversing the current, the processing device may use an state of charge-open circuit voltage curve and coulomb counting formula to determine the initial state of charge of the charge cycle.

If the noise is not higher than n_TH, then the processing device determines if the rest time before charge cycle is greater than a predefined threshold (t_TH). If it does not exceed t_TH, then the processing device reverses the charge cycle data at 714 and determines the initial state of charge using coulomb counting with the reversed charge cycle data at 716.

In other words, in some embodiments, the noise level is of the BMS is considered and if the noise level is too high, or in cases where the noise level is lower than the threshold but the rest time before the charge cycle is not longer than a set threshold, the processing device may determine the state of charge by reversing the current and using a coulomb counting formula described further herein.

If the rest time before charge cycle exceeds threshold t_TH, then the processing device proceeds to determine the initial state of charge of the battery pack using a state of charge-open circuit voltage curve at 718 as described further herein.

In other words, in some embodiments, where the noise level is lower than a threshold and the rest time before the charge cycle is longer than a set threshold, the processing device may determine the initial state of charge by analyzing the state of charge-open circuit voltage table without reversing the current. The threshold may be configurable to enable flexibility and adjust and optimize the initial state of charge detection process.

After the initial state of charge is determined, the processing device may use the initial state of charge and charge cycle data (e.g., battery pack current, battery module voltages, battery health metrics, etc.) to simulate the charging cycle to reconstruct state of charge in a whole cycle at 720. At 722, the processing device may determine the state of health of the battery based on the simulated charging cycle. At 724, the processing device may determine a confidence score that represents the accuracy of the state of health by analyzing the charge cycle and an aging battery dataset 510 (e.g., compares the simulated charge cycle (states of charge, accumulated Ampere-hours, etc.) with information in the aging battery dataset 510). At 726, a predicted state of health is output. The state of health may be used to provide a notification to the computing device 102, to control a parameter of the battery 118, etc.

Figure 8:
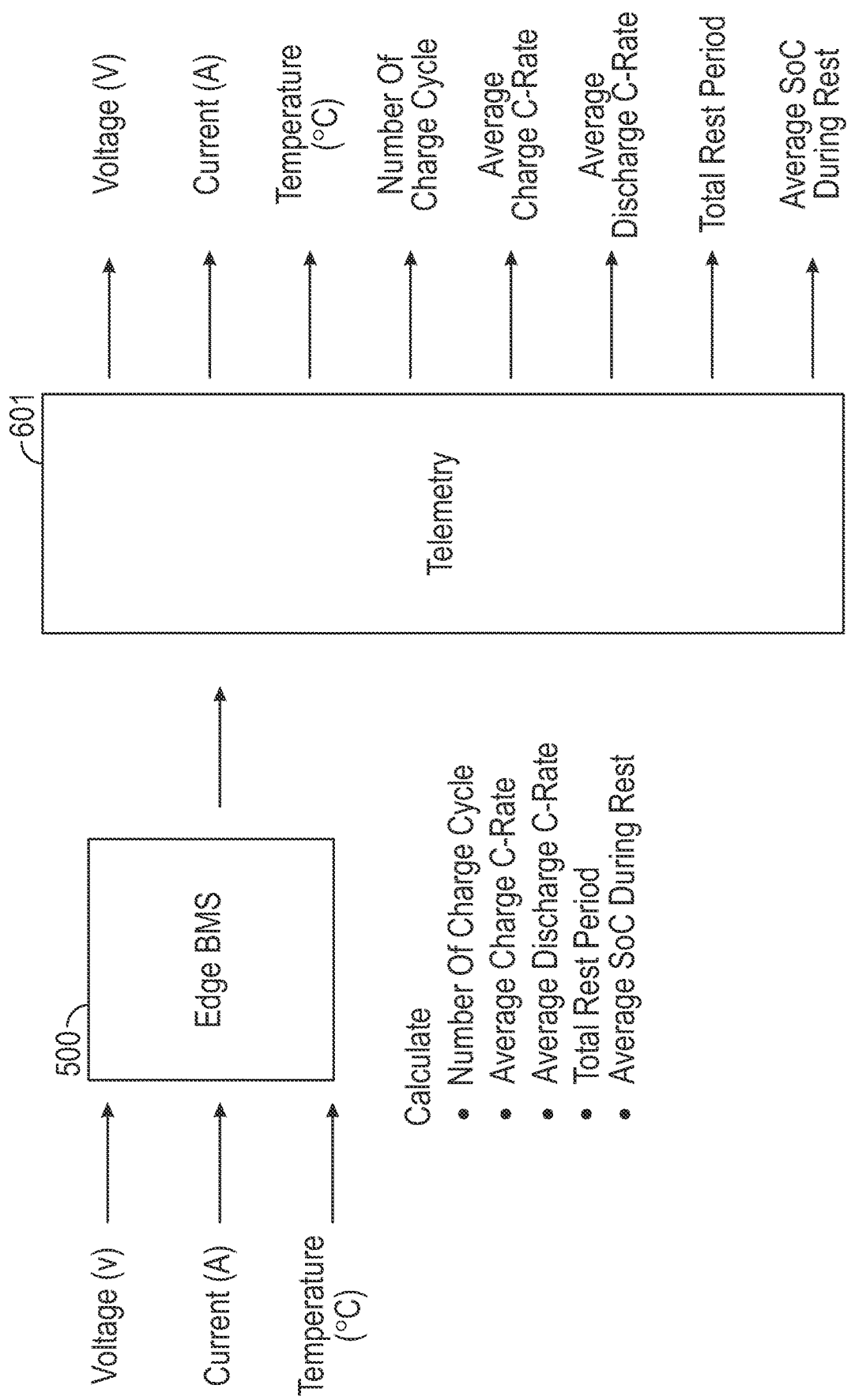
FIG. 8 illustrates an example block diagram for transferring data from a vehicle's battery management system to a cloud-based system according to certain embodiments of this disclosure.

FIG. 8 illustrates an example block diagram for transferring data from a vehicle's battery management system 500 to a cloud-based computing system 116 according to certain embodiments of this disclosure. Data transfer refers to a process of collecting data from the edge, determining some parameters, and transmitting them to the cloud-based computing system 116 for monitoring, analysis, decision-making, and/or control. The edge battery management system 500 may receive data measured by sensors 131 associated with a battery, such as current, voltage, and temperature. The edge battery management system 500 may use the received information to determine a number of charge cycles of the battery, average charge c-rate, average discharge c-rate, total rest period, average state of charge during rest, and the like. A set of parameters that includes the number of charge cycles, average charge and discharge c-rates, total rest period, and average state of charge during rest may be referred to as "battery health metrics" herein.

Telemetry 601 may transmit the battery health metrics, as well as the voltage, current, and temperature, to the cloud-based computing system 116. The cloud-based computing system 116 may use the information to perform algorithms and analytics that identify trends, potential issues, and recommend preventative maintenance measures. As a result, the disclosed techniques may improve overall reliability, performance, and safety of electric vehicles while reducing operating costs and extending battery life.

Figure 9:
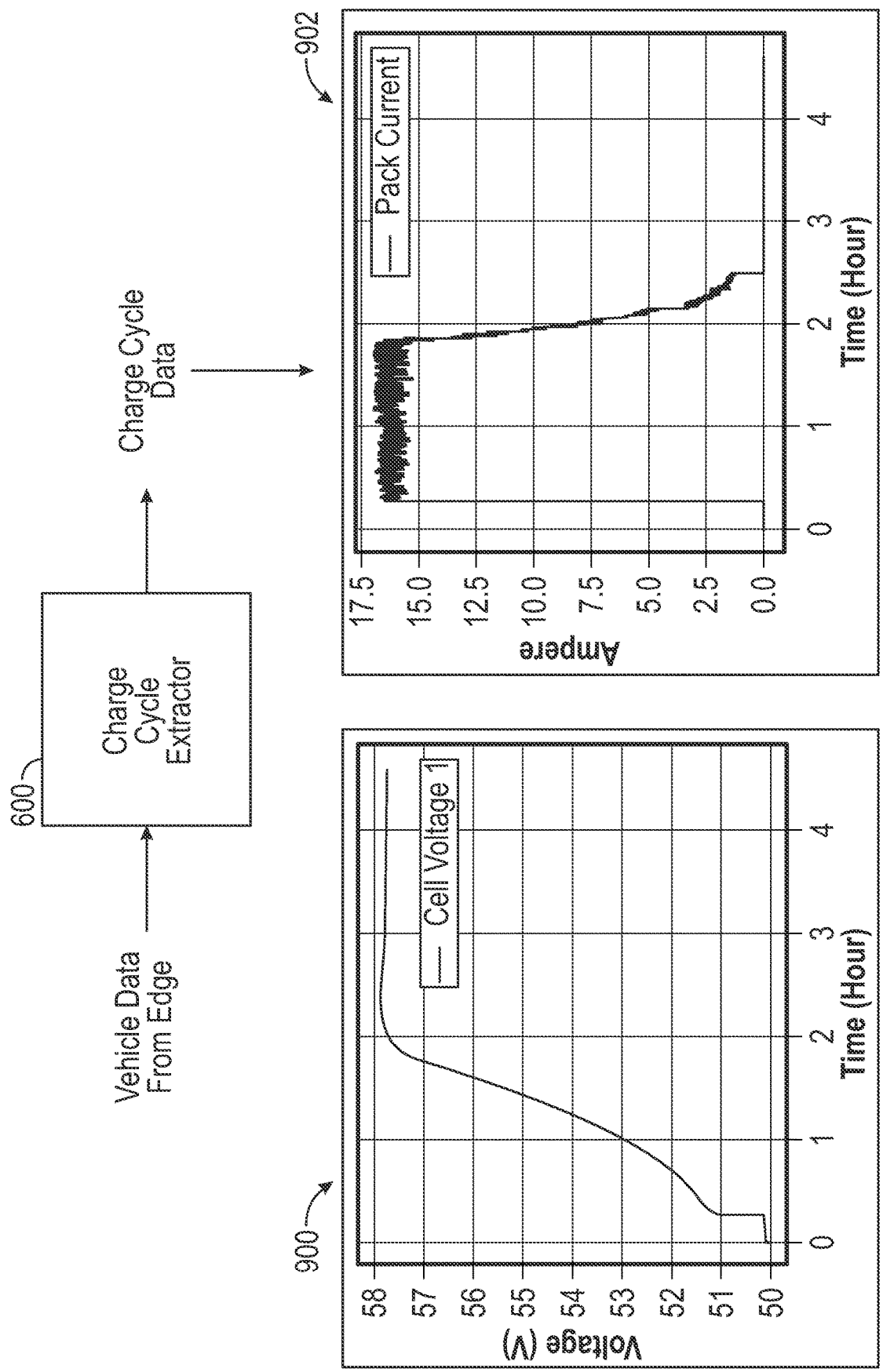
FIG. 9 illustrates an example block diagram a charge cycle extractor according to certain embodiments of this disclosure.

As described further herein, an aging battery dataset 510 may be generated with corresponding state of health values by incorporating the battery health metrics FIG. 9 illustrates an example block diagram a charge cycle extractor 600 according to certain embodiments of this disclosure. The charge cycle extractor 600 may be implemented in instructions stored on one or more memory devices and executed by one or more processing devices of the cloud-based computing system 116. The charge cycle extractor 600 may determine the charge events and rest periods in the battery operation. Charge events may refer to the periods when the battery is being charged, while rests may refer to the periods when the battery is not being charged or discharged. By analyzing the charge events and rests, it is possible to determine the battery's state of health accurately. Charge evens may be desirable for state of health estimation because the discharge data may be noisier due to variations in the load and the battery's internal resistance. Charge events may be more stable and repeatable, which may make them more a reliable source of data for state of health determination.

The charge cycle extractor 600 may identify the start and end of each charge event and determine the duration of each event. The charge cycle extractor 600 may also determine the rest durations before and after each charge event, which may be used in some embodiments to determine the state of health of the battery.

Once the charge events and rests have been identified, the data may be analyzed to determine the accumulated ampere-hour (Ah) and other parameters that may be used for state of health determination. This information may be used to develop accurate models of the battery's behavior, which may be used for optimizing battery usage and predicting the battery's future performance. The charge cycle extraction process may be applied to different charging methods (constant charging, constant current-constant voltage charging, multistep charging) used in electric vehicles. Graph 900 illustrates voltage data of the charge cycle and graph 902 illustrates current data of the charge cycle.

Figure 10:
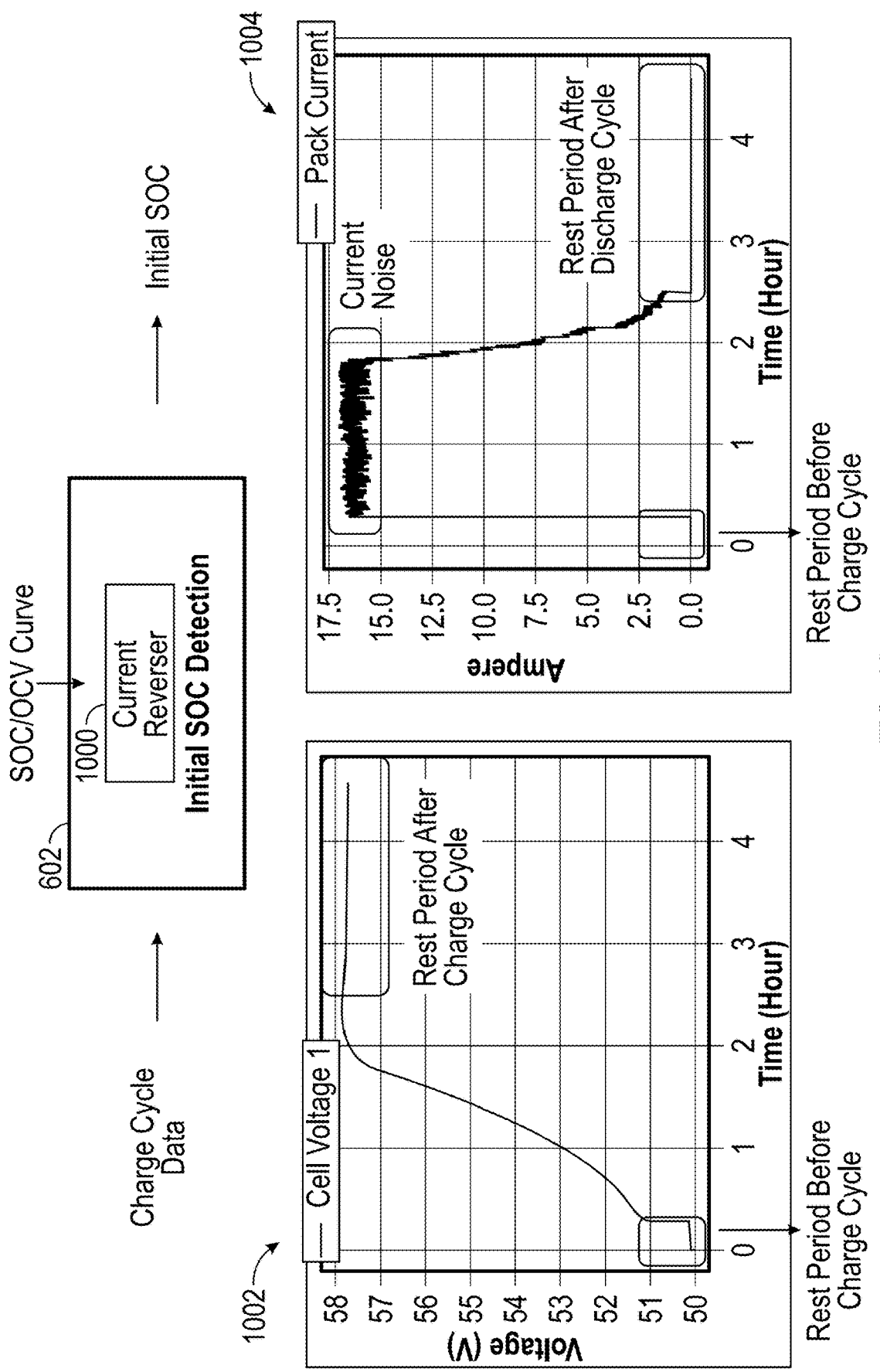
FIG. 10 illustrates an example block diagram for determining an initial state of charge according to certain embodiments of this disclosure.

FIG. 10 illustrates an example block diagram for determining an initial state of charge according to certain embodiments of this disclosure. The initial state may be used for accurately simulating a charging cycle. Accurate estimation of state of charge using coulomb counting may be performed with a precise starting point. State of charge may be determined by looking up the state of charge-open circuit voltage using a curve at rest points. However, as depicted in the voltage graph 1002 and current graph 1004, the rest period before the charge cycle is often not sufficient for the battery to reach a true resting state, which makes it challenging to obtain an accurate state of charge estimate directly from the state of charge-open circuit voltage curve. As depicted by the graphs 1002 and 1004, the rest period after charge cycle is longer and may be desirable to determine the state of charge directly using the state of charge-open circuit voltage curve. In some embodiments, this longer rest duration following the charging cycle is used when determining the initial state of charge. Such a technique may improve the accuracy of the state of charge estimation. As described further herein, a current reverser 1000 may be used during initial state of charge detection 602 to reverse the current graph such that the rest period before charging cycle is longer than the rest period after charging cycle.

Figure 11:
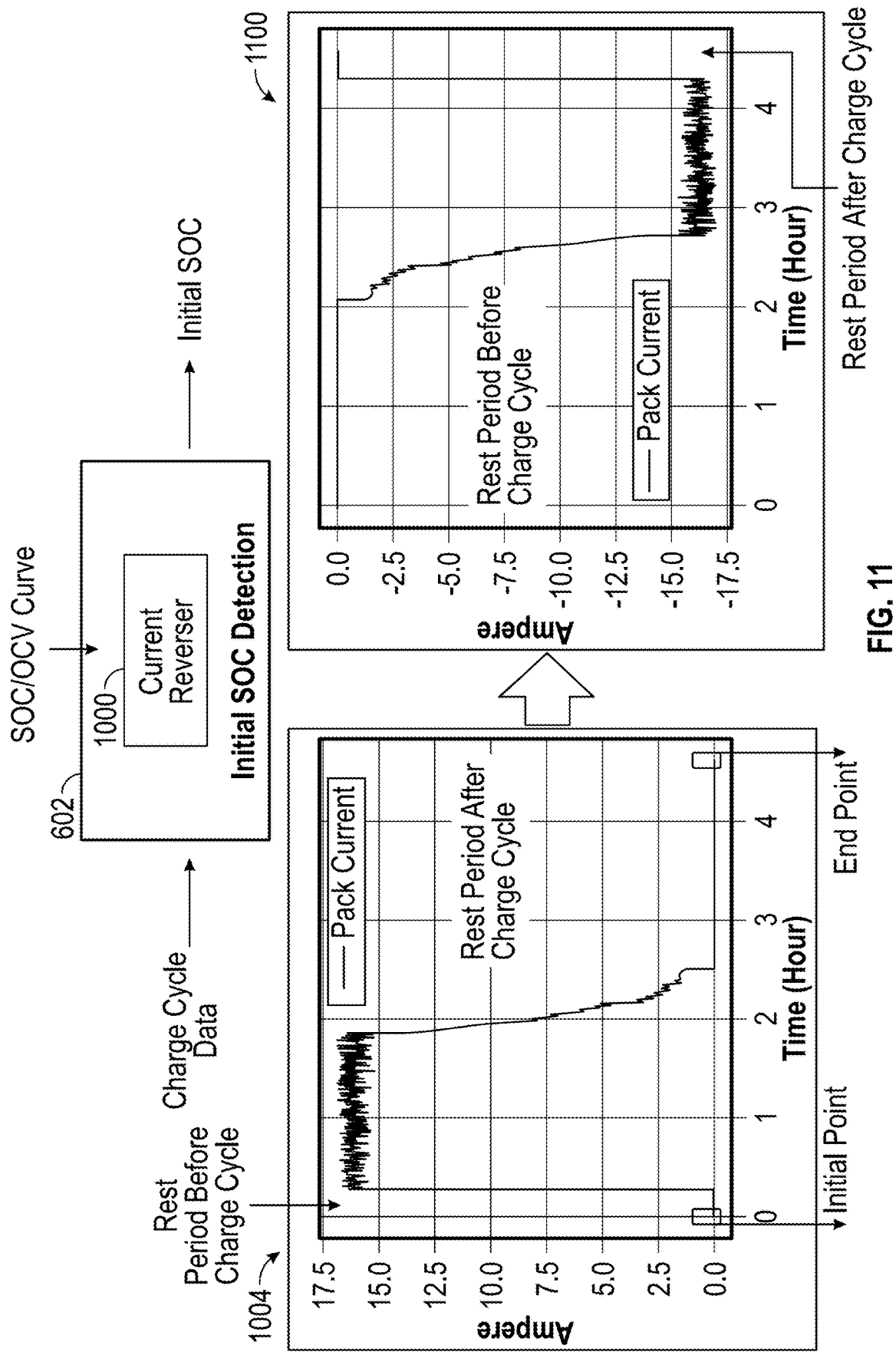
FIG. 11 illustrates an example block diagram for determining an initial state of charge using current reversing according to certain embodiments of this disclosure.

FIG. 11 illustrates an example block diagram for determining an initial state of charge using current reversing according to certain embodiments of this disclosure. As depicted, the current reverser 1000 uses the current graph 1004 with identified initial point and end points and reverses the current to generate reversed current graph 1100. As depicted in the reversed current graph 1100, the rest period before charging cycle is now longer than the rest period after charging cycle. In some embodiments, initial state of charge may be determined based on the voltage at the end of the charge cycle. After the current is reversed, a coulomb counting formula may be used to determine the initial state of charge with the reversed current:

$$SOC(t) = SOC(t-1) + \frac{\text{Current}(t) * \Delta t}{\text{Nominal Capacity} * SOH}, \quad \text{Equation 1}$$

$$t > 1, \Delta t = t - (t-1)$$

SOC(t=) may be determined by analyzing the state of charge-open circuit voltage curve. The rest period at that point is long enough for the battery to stabilize (rest time A.C.C.>t_TH), which may make the state of charge-open circuit voltage curve a reliable reference for state of charge estimation.

In some embodiments, an objective may include determining the state of charge end point with the reverse current. This state may correspond to the initial point state of charge without reversing the current. Using the coulomb counting formula, the state of charge may be determined at each timestamp sequentially to reach a desired state of charge end point. Once the state of charge end point is determined, intermediate states of charges may be discarded, in some embodiments.

Nominal capacity may refer to the maximum amount of energy a battery can store when it is new or at the beginning of its life cycle and is fully charged. It may represent the theoretical capacity of the battery under ideal conditions and may be measured in ampere-hours (Ah). The SOH (state of health) in Equation 1 represents the previously calculated SOH. At the start of its lifecycle, the SOH assumes a value of 1.0. Throughout its lifetime, the value ranges between 0 and 1.0. The multiplication of nominal capacity and SOH gives the current condition of the battery's capacity.

Figure 12:
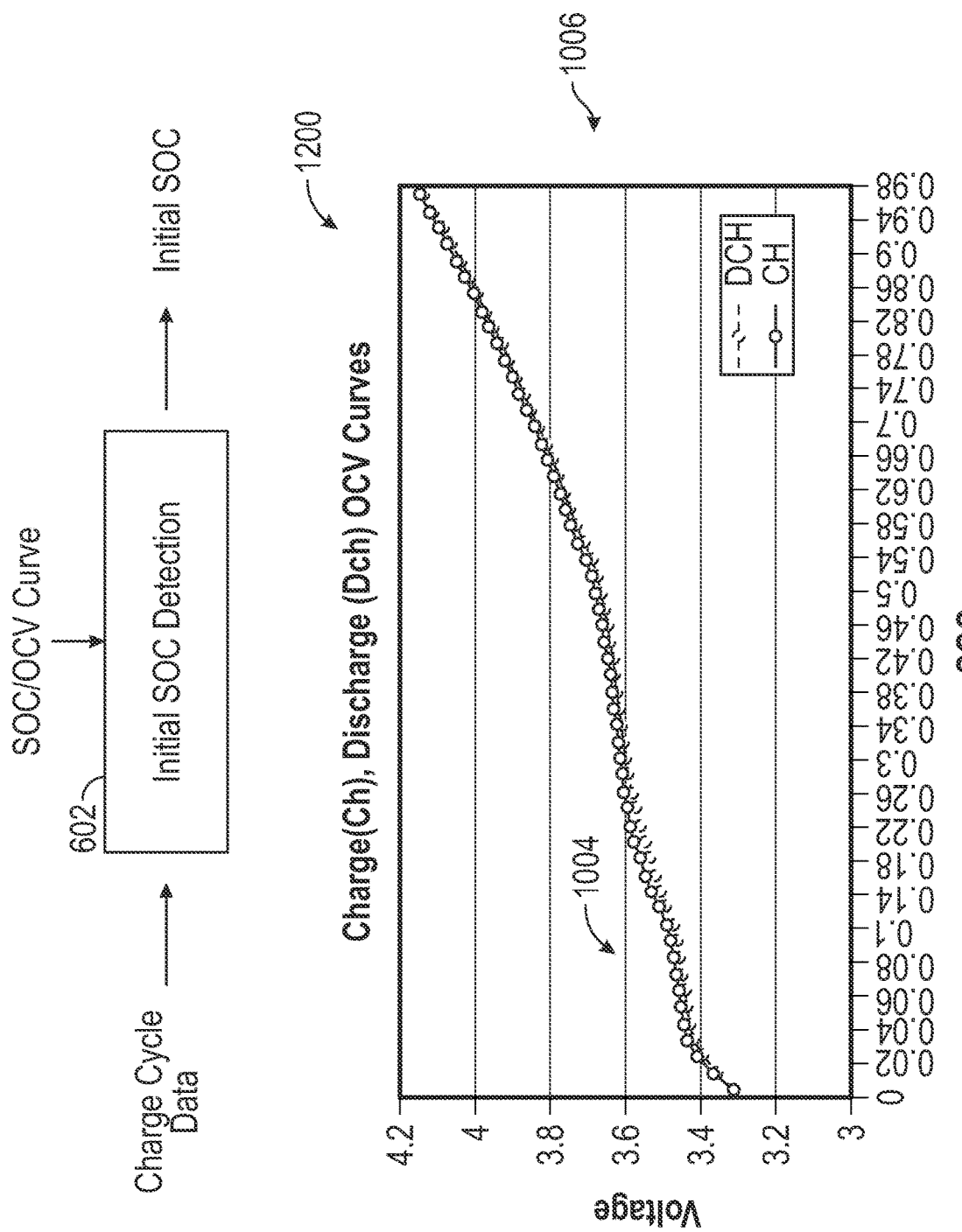
FIG. 12 illustrates an example block diagram for determining an initial state of charge using a state of charge-open circuit voltage chart according to certain embodiments of this disclosure.

FIG. 12 illustrates an example block diagram for determining an initial state of charge using a state of charge-open circuit voltage curve 1200 according to certain embodiments of this disclosure. As depicted, state of charge-open circuit voltage curve 1200 represents a state of charge of a battery on the X-axis and a voltage on the Y-axis. The state of charge-open circuit voltage curve 1200 represents how the open circuit voltage changes as the battery discharges or charges, essentially linking the battery's state of charge with its voltage. This curve 1200 is unique to each battery chemistry and can vary with conditions such as temperature and battery age. The initial state of charge detection 602 may use the state of charge-open circuit voltage curve 1200 to determine the initial state of charge.

Figure 13:
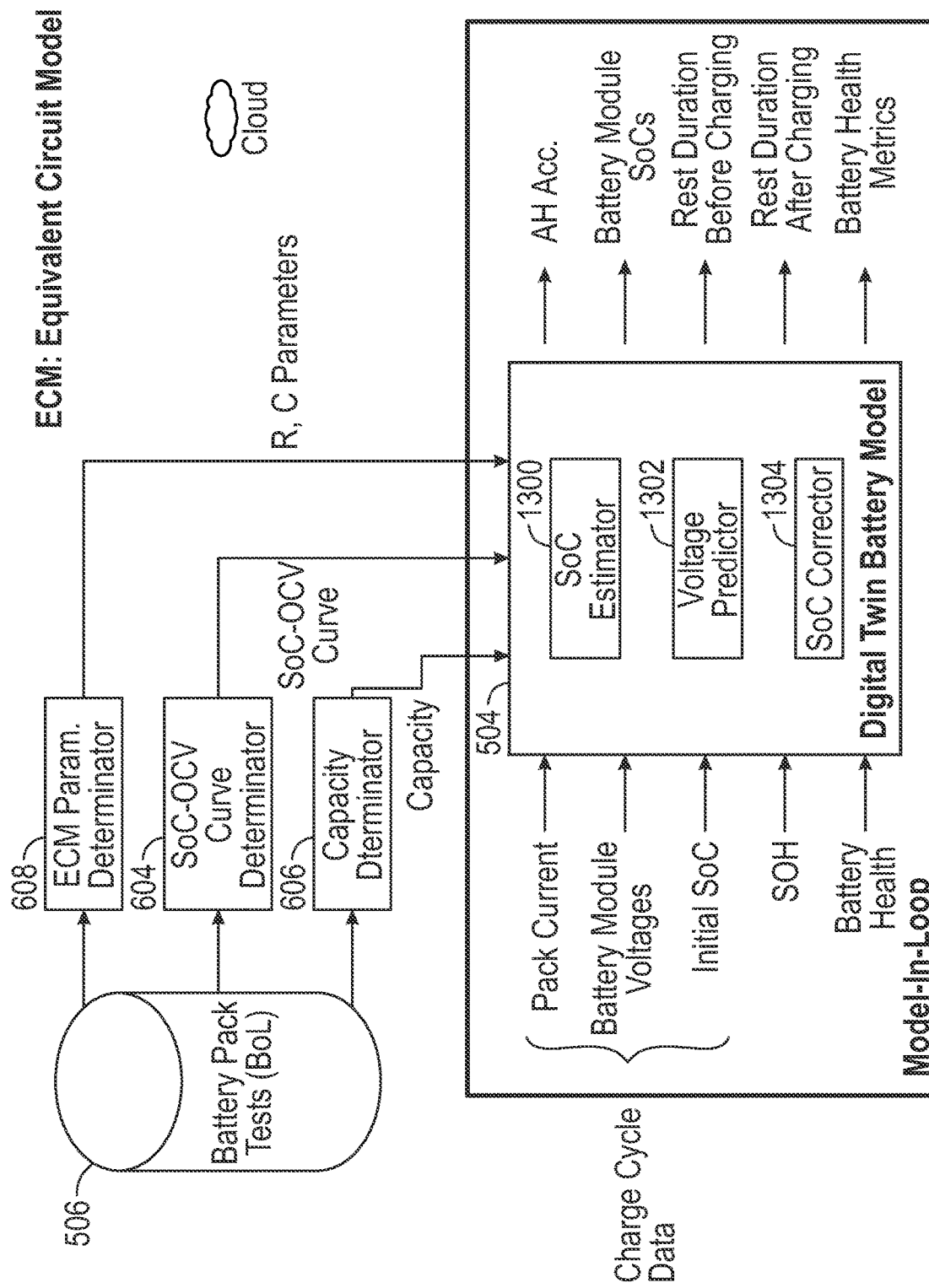
FIG. 13 illustrates an example block diagram for performing model-in-loop simulation according to certain embodiments of this disclosure.

FIG. 13 illustrates an example block diagram for performing model-in-loop simulation according to certain embodiments of this disclosure. As depicted, the digital twin battery model 504 may receive numerous input data. The input data may include charge cycle data (e.g., battery pack current, battery module voltages, initial state of charge), a state of health determined by a battery management system, and/or battery health metrics. Further, input may include capacity from the capacity determinator 606, an state of charge-open circuit voltage curve from the SoC-OCV curve determinator 604, and/or resistance and capacitance parameters from the equivalent circuit model determinator 608. Some of the information may be derived from laboratory tests 506 that include capacity tests, state of charge-open circuit voltage characterization tests, and pulse tests. In some embodiments, the capacity determinator 606, the SoC-OCV curve determinator 604, and/or the equivalent circuit model determinator 608 may be implemented in instructions stored on one or more memory devices and executed by one or more processing devices of the cloud-based computing system 116.

The digital twin battery model 504 may include several components that are implemented in instructions stored in one or more memory devices and executed by one or more processing devices of the cloud-based computing system 116. The components may include a state of charge estimator 1300, a voltage predictor 1302, and a state of charge corrector 1304. The components may be used to predict battery cell voltages and determine one or more states of charges. Measured voltage may be used to correct these values. To simulate a charge cycle, the battery pack current, battery module voltages, and initial state of charge may be fed into the digital twin battery model 504 to output the battery module states of charges and determine accumulated ampere-hour (AH Acc.). Further, the rest durations before and after charge event are also determined and output by the digital twin battery model 504. In some embodiments, the disclosed techniques may more accurately estimate the state of charge and state of health of the battery pack, thereby potentially improving the accuracy of BMS calculations and enhancing the performance of electric vehicles.

Figure 14:
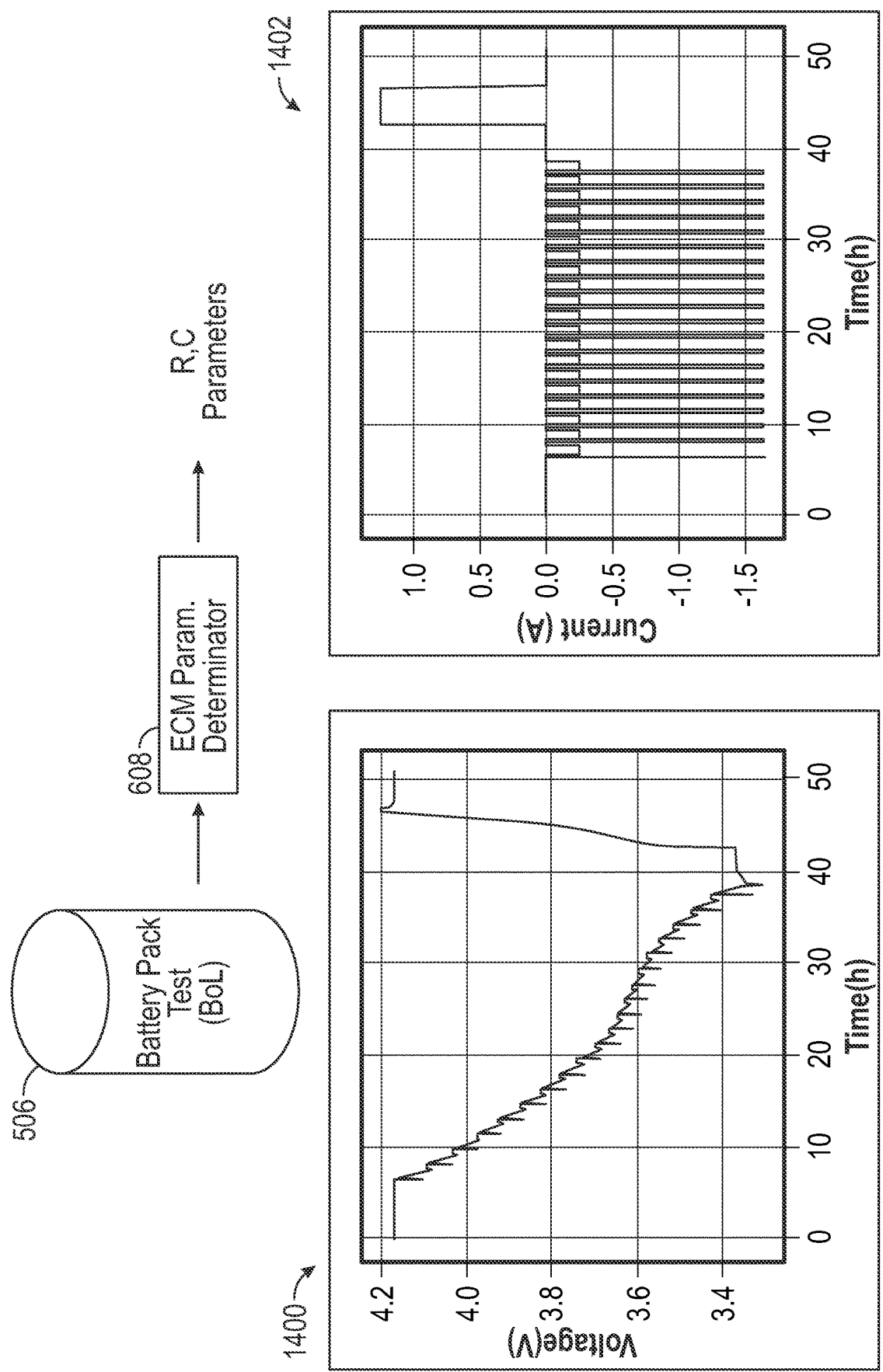
FIG. 14 illustrates an example block diagram for using an equivalent circuit model parameter determinator to determine resistance and capacitance parameters according to certain embodiments of this disclosure.

FIG. 14 illustrates an example block diagram for using an equivalent circuit model parameter determinator 608 to determine resistance and capacitance parameters according to certain embodiments of this disclosure. At the beginning of the life of cells, several tests may be conducted in the laboratory to characterize the battery's performance. Some of these tests may include pulse tests, capacity tests, and state of charge-open circuit voltage determination tests.

Pulse tests may be used to determine a battery's internal resistance and resistance-capacity pairs. Current pulses with different c-rates are applied to the battery, and the voltage response is measured. These tests may be useful for characterizing the battery's internal resistance, capacities, and determining its ability to deliver power under different conditions. The resistance-capacitance (RC) values may be used to represent the dynamic behavior of a battery.

The equivalent circuit model determinator 608 may use an algorithm to extract the resistance (R) and capacitance (C) parameters from pulse tests conducted on batteries. Graph 1400 depicts voltage data obtained from a pulse test and graph 1402 depicts current data obtained from a pulse test. The equivalent circuit model determinator 608 may use mathematical models to analyze the voltage response of the battery during the pulse test and extract the R and C parameters. The R parameter represents the battery's internal resistance, which may affect the battery's performance and lifespan. The C parameter represents the battery's capacitance, which is a measure of the battery's ability to store electrical charge.

Figure 15:
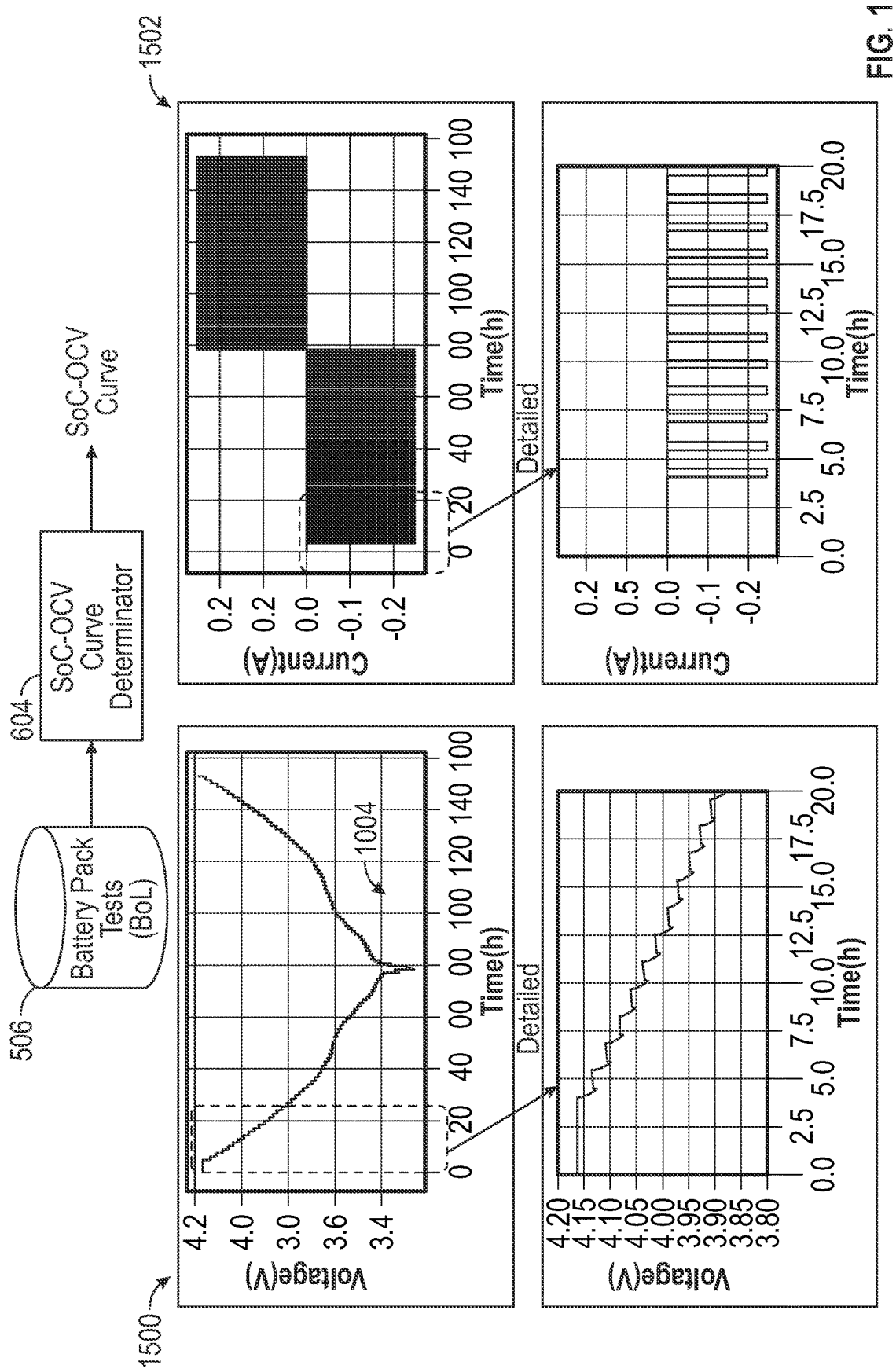
FIG. 15 illustrates an example block diagram for using a state of charge-open circuit voltage curve determinator to determine a state of charge-open circuit voltage according to certain embodiments of this disclosure.

FIG. 15 illustrates an example block diagram for using a state of charge-open circuit voltage curve determinator 604 to determine a state of charge-open circuit voltage according to certain embodiments of this disclosure. State of charge-open circuit voltage determination tests may be used to measure the battery's open circuit voltage at different states of charge. The battery is charged to a known state of charge level, allowed to rest for a period of time, and then the open circuit voltage is measured. The test is useful for determining the relationship between the battery's state of charge and open circuit voltage, which can be used for estimating the battery's state of charge during normal operation. By conducting these tests at the beginning of the battery's life, a baseline may be established for the battery's performance and this information may be used to improve the accuracy of the simulation approach for estimating state of charge and state of health implemented by some of the disclosed techniques.

The state of charge-open circuit voltage determinator 604 may use an algorithm to extract the state of charge-open circuit voltage curve of a battery by measuring the open circuit voltage of the battery at different state of charge points. The voltage graph 1500 and the current graph 1502 depict data obtained from a state of charge-open circuit voltage determination test.

Figure 16:
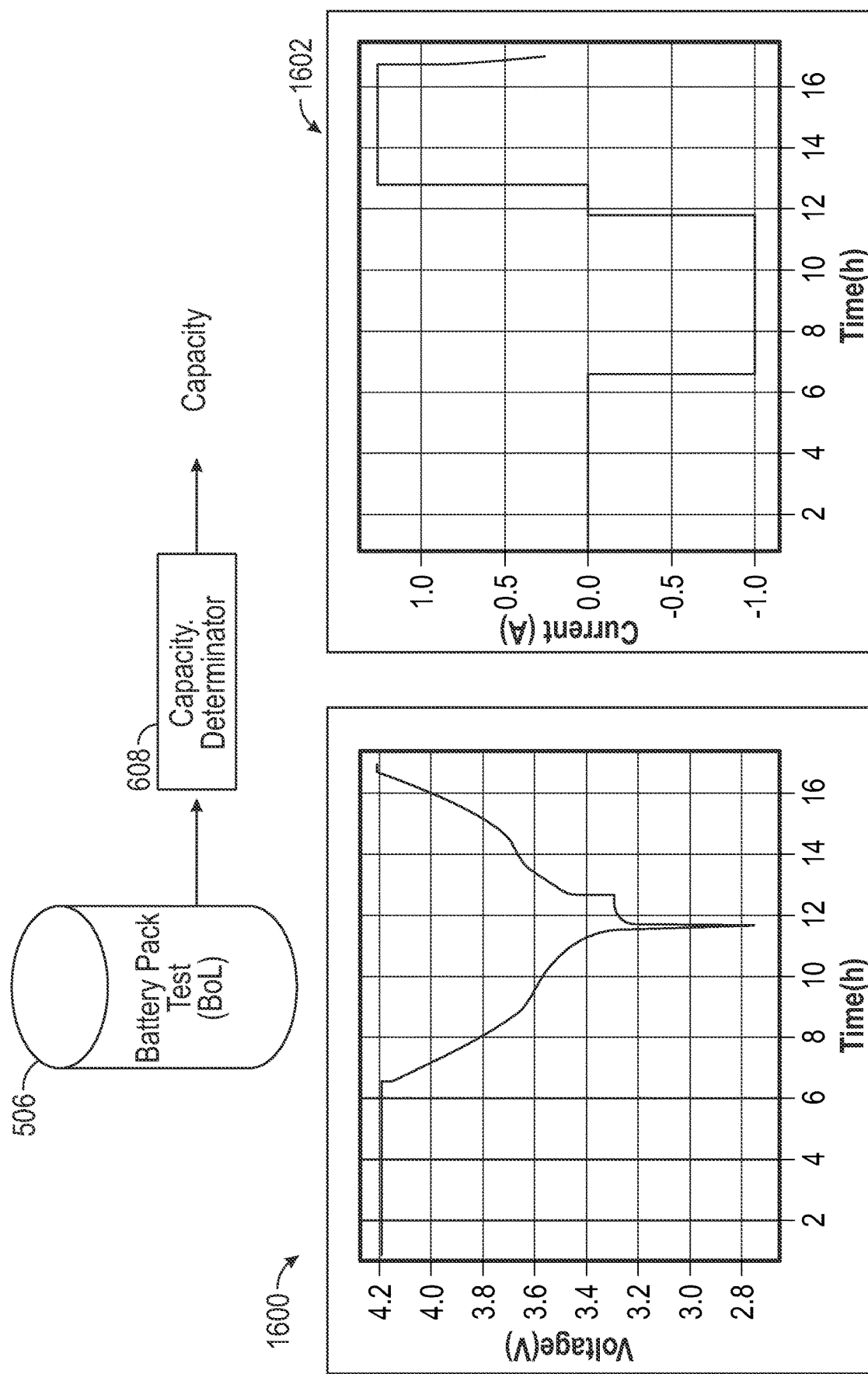
FIG. 16 illustrates an example block diagram for using a capacity determinator to determine a capacity according to certain embodiments of this disclosure.

FIG. 16 illustrates an example block diagram for using a capacity determinator 606 to determine a capacity according to certain embodiments of this disclosure. Capacity tests may be used to measure the amount of charge that the battery can store. The battery may be charged and discharged at a constant current rate, and the total charge delivered is measured. This test may be useful for determining the battery's capacity and understanding how it performs under different charging and discharging conditions.

The capacity determinator 606 may use an algorithm to compute the ampere-hours accumulated during a capacity test. The capacity determinator 606 may use a mathematical algorithm to analyze the ampere-hours accumulated during the capacity test and calculate the capacity of the battery based on the test results. The capacity of the battery may be expressed in ampere-hours and represents the amount of energy that the battery can store and deliver under specific conditions. Graph 1600 and graph 1602 represent current and voltage data, respectively, obtained from a capacity test.

Figure 17:
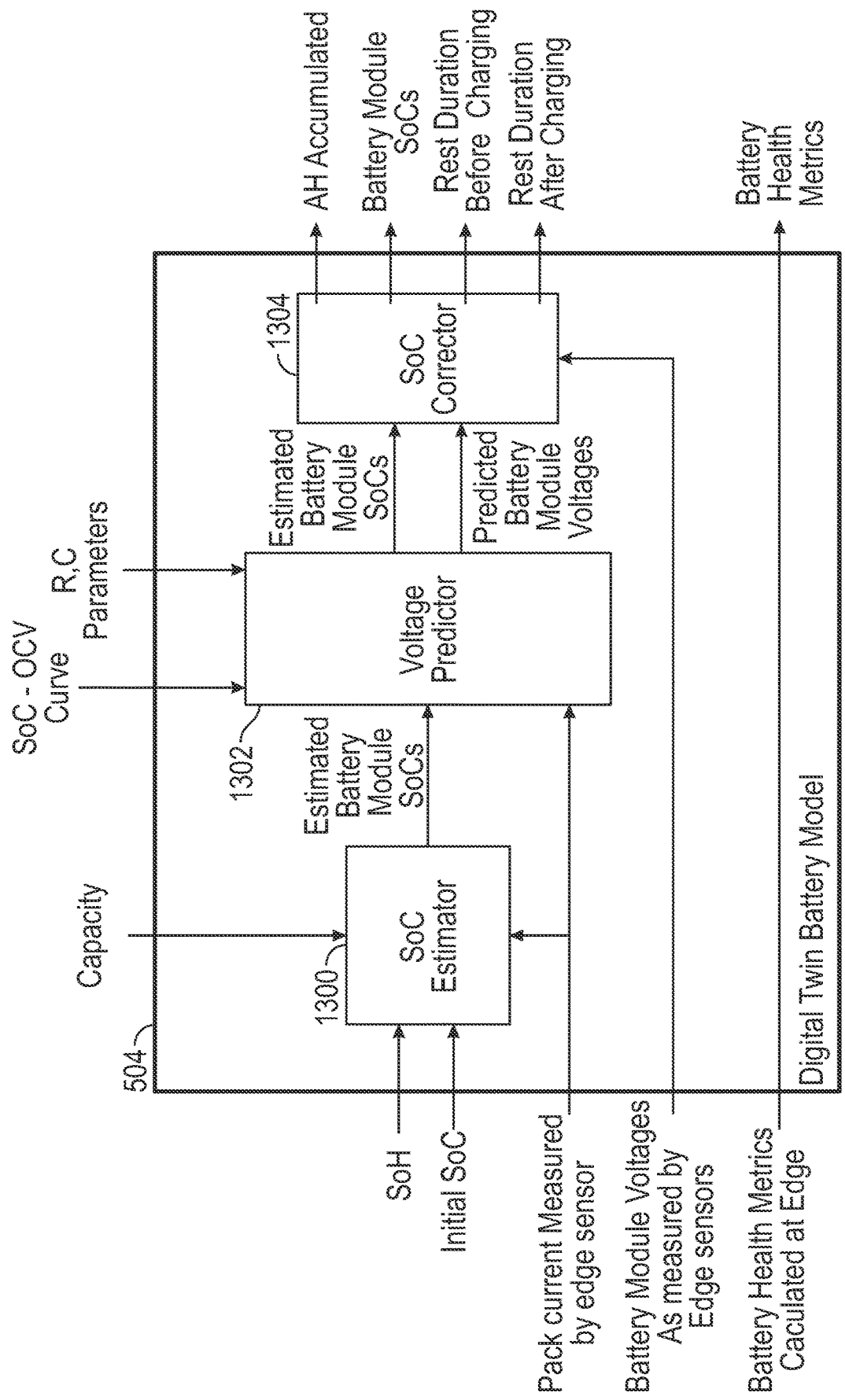
FIG. 17 illustrates an example block diagram for a digital twin battery model according to certain embodiments of this disclosure.

FIG. 17 illustrates an example block diagram for a digital twin battery model 504 according to certain embodiments of this disclosure. The digital twin battery model 504 includes the state of charge estimator 1300, the voltage predictor 1302, and the state of charge corrector 1304. Each of the components 1300, 1302, and 1304 may be implemented in instructions stored on one or more memory devices and executed by one or more processing devices of the cloud-based computing system 116.

The state of charge estimator 1300 may receive inputs such as a state of health, an initial state of charge, a battery pack current measured by the sensors 131, and a capacity. In some embodiments, the state of health received by the state of charge estimator 1300 may have been determined by the BMS at the vehicle 117. The state of charge estimator 1300 may use the coulomb counting formula in Equation 1 to estimate one or more states of charges.

The voltage predictor 1302 may predict the battery module voltages using resistance and capacitance parameters, battery pack measured current, estimated states of charges, and/or the state of charge-open circuit voltage curve. With the resistance and capacitance values and the current, the voltage predictor 1302 predicts polarization voltages. The voltage predictor 1302 determines a terminal voltage by adding the polarization voltages and the open circuit voltage. The voltage predictor 1302 may output the estimated one or more states of charges and predicted battery module voltages to the state of charge corrector 1304.

The state of charge corrector 1304 improves the accuracy of the one or more estimated states of charges by comparing the predicted voltages with battery module voltages measured by the sensors 131 at the edge. If the difference between the measured voltages and the predicted voltages is large, the correction on the state of charge will also be large. For example, when the voltage difference is 100 mV, the state of charge correction may be 2%. Similarly, when the voltage difference is 50 mV, the state of charge correction may be 1%. This correction mechanism may ensure that the estimated states of charges align more closely with the actual states of charges based on the voltage differences. In some embodiments, the state of charge corrector 1304 may output one or more corrected states of charges.

Further, the state of charge corrector 1304 may determine ampere-hours (Ah) accumulated, which depends on the current flow and the time duration for which the current flows. The below equation represents how Ah accumulated (AH Accu) is determined:

$$AHAccu(t) = AHAccu(t-1) + \text{Current}(t) * \Delta t \quad \text{Equation 2}$$

$$\Delta t = t - (t-1) \quad \text{Equation 3}$$

Further, the state of charge corrector 1304 may determine a rest duration before charging cycle (B.C.C.) using the below equation:

$$\text{Rest Duration } B.C.C.(h) = \quad \text{Equation 4}$$
$$\text{Time}_{of} \text{ Current Flow Start in Charging}$$
$$-\text{Time of Rest Start Before Charging}$$

Further, the state of charge corrector 1304 may determine a rest duration after charging cycle (A.C.C.) using the below equation:

$$\text{Rest Duration } A.C.C.(h) = \quad \text{Equation 5}$$
$$\text{Time}_{of} \text{ Current Flow Start After Charging}$$
$$-\text{Time of Rest Start After Charging}$$

Accordingly, the state of charge corrector 1304 may output the Ah accumulated, the corrected states of charges, the rest duration before charging, and the rest duration after charging.

Figure 18:
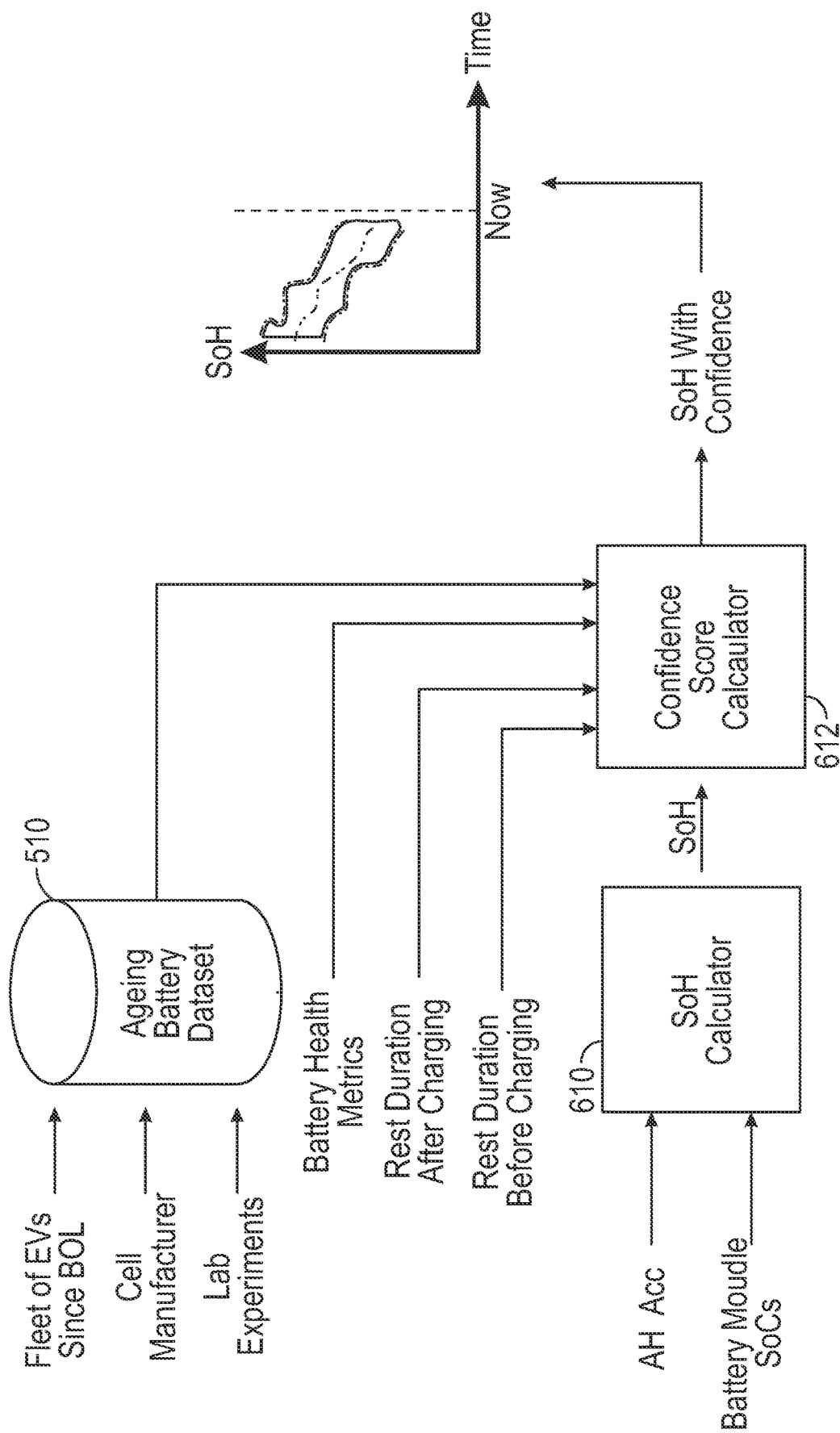
FIG. 18 illustrates an example block diagram for determining a confidence score for a state of health according to certain embodiments of this disclosure.

FIG. 18 illustrates an example block diagram for determining a confidence score for a state of health according to certain embodiments of this disclosure. The state of health may be determined by the state of health calculator 610 based on the accumulated current (Ah accumulated) in charge cycle and the battery module states of charges determined by the state of charge corrector 1304 described above. The state of health may reference to the capacity of the battery cells, battery modules, and/battery pack. To determine the state of heath, in some embodiments a minimum capacity among all cell capacities may be identified. Once the minimum capacity is determined, the battery pack state of health may be determined by dividing the minimum capacity by the nominal capacity. Such a process may ensure that the weakest cell in the pack determines the battery pack's overall capacity and state of health. The below equations represent how to determine the capacities of the modules:

$$\text{Module 1 Capacity} = \frac{\text{Battery Module 1 } AHAcc.}{(\text{Battery Module 1 } SOC \text{ End}) - (\text{Battery Module 1 } SOC \text{ Init}} \quad \text{Equation 6}$$

$$\text{Module N Capacity} = \frac{\text{Battery Module } N \text{ } AHAcc.}{(\text{Battery Module } N \text{ SOC End}) - (\text{Battery Module } N \text{ SOC Init})} \quad \text{Equation 7}$$

Once the modules capacities are determined, the below equation may be used to identify the minimum capacity:

$$\text{Minimum Capacity} = \quad \text{Equation 8}$$
$$\min(\text{Module 1 Capacity, ... Module N Capacity})$$

Once the module with the minimum capacity is determined, then the state of health may be determined by the below equation:

$$\text{State of Health} = \text{Minimum Capacity} - \text{Nominal Capacity} \quad \text{Equation 9}$$

Using the disclosed techniques may enable finding the module with the lowest capacity within a battery pack, which may be replaced. Replacing the weakest battery module may result in an extension of the overall lifespan of the battery packs.

The confidence score calculator 612 may receive the determined state of health from the state of health calculator 610 and may receive several other inputs. For example, the confidence score calculator 612 may receive battery health metrics, rest duration after charging (determined by the state of charge corrector 1304), rest duration before charging (determined by the state of charge corrector 1304), and information from the aging battery dataset 510. The aging battery dataset 510 may include information related to a fleet of electric vehicles' batteries since beginning of life, cell manufacturer specifications, laboratory experiments, and the like.

The aging battery dataset 510 may be generated using data from various sources, such as the age history of a fleet of electric vehicles, battery cell manufacturer specifications, and laboratory tests for cyclic aging and calendar aging tests. The age history of a fleet of electric vehicles may provide information on how the batteries have aged over time under real-world usage conditions and patterns. This data can include information on a number of charge cycles, average temperature, average discharge and charge rates, rest period durations, average state of charge values during rest periods, and corresponding state of health values.

The fleet of electric vehicle dataset may be updated with the latest high confidence state of health values obtained from the electric vehicle each time, and initially the dataset may be empty.

Laboratory tests for cyclic aging and calendar aging tests involve subjecting the battery cells to controlled conditions of temperature, humidity, and cycling to simulate the aging process. This data may provide insights into how the battery cells perform under different conditions and how they degrade over time.

The laboratory test data may include various parameters such as the number of charge cycles, average ambient temperature, average discharge and charge rates, rest period durations, average state of charge values during rest periods, and corresponding state of health values.

Cell manufacturer specifications may provide information on the nominal capacity of the battery cells, modules, and/or pack. The cell manufacturer specifications may also provide information on voltage, and other technical characteristics of the battery cells. This data may be used to establish a baseline for the battery's performance and to compare the actual performance of the battery with its design specifications. By combining data from these various sources, an aging battery dataset 510 may be generated that may be used to compare and validate the estimated state of health of the battery pack.

As described further herein, the confidence score calculator 612 may determine a confidence score for the state of health. The confidence score may represent an accuracy of the state of health. To determine the confidence score, several parameters such as rest durations in charge cycle, accumulated Ah data, cycle test state of health result with accumulated current, electric vehicles state of health table with accumulated Ah since beginning of life, and c-rates may be taken into account. By considering the rest durations before and after charge cycle, the accuracy of the state of charge may be improved, which in turn, enhances the accuracy of the state of health. Further, comparing the determined state of health with the state of health for electric vehicles in the aging battery dataset 510 based on c-rates and accumulated Ah may enhance determining the confidence score.

Figure 19:
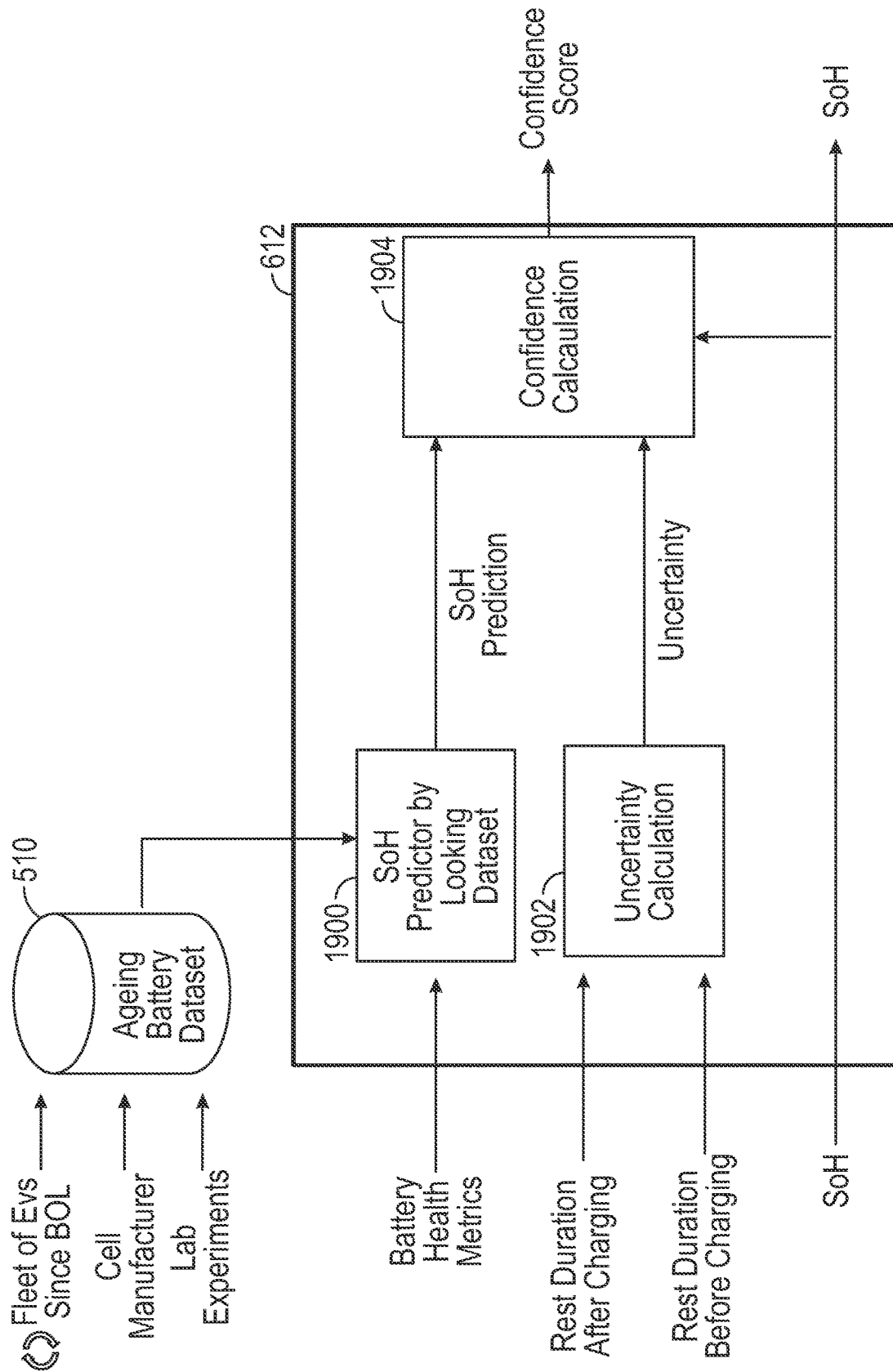
FIG. 19 illustrates an example block diagram for a confidence score calculator according to certain embodiments of this disclosure.

FIG. 19 illustrates an example block diagram for a confidence score calculator 612 according to certain embodiments of this disclosure. The confidence score calculator 612 includes instructions (1900) for predicting a state of health by looking at the aging battery dataset 510, instructions (1902) for uncertainty calculation, and instructions (1904) for confidence calculation. The output of the confidence score calculator 612 may include a confidence score and the determine state of health determined by state of health calculator 610. The confidence score calculator 612 may be implemented in instructions stored on one or more memories and executed by one or more processing devices of the cloud-based computing system 116.

To determine the confidence score of the determined state of health, a combination of lab cycle tests and fleet data of electric vehicles since the beginning of life in the battery aging dataset 510 may be used. For example, the instructions 1900 may use fleet data and lab cycle data to predict the state of health of the battery based on the battery health metrics of the battery being analyzed. For example, the number of charge cycles, average discharge and charge rates, rest period durations, and average state of charge values during rest periods of the vehicle may be compared to the aging battery dataset 510 to predict the state of health of the battery pack. On the other hand, the determined state of health value was explained above with reference to the equations in FIG. 18. With both the predicted state of health and the determined state of health values, a comparison may be made to determine an accuracy of the determined state of health.

However, in order to assign a confidence score to the determined state of health, the uncertainty of the determined state of health needs to be determined. The instructions (1902) may receive the rest duration after charging and the rest duration before charging to determine the uncertainty. An equation for determining the uncertainty is represented below:

$$\text{Uncertainty} = A * \exp(-B * (Avg.\text{Rest Period} - Threshodl)) \quad \text{Equation 10}$$

$$Avg.\text{Rest Period} = \frac{\text{Rest Period Before Charge Cycle} + \text{Rest Period After Charge Cycle}}{(2)} \quad \text{Equation 11}$$

In Equation 10, A and B are positive constants that control the shape of the decay function. A determines the maximum uncertainty when the average rest period is equal to the threshold, and B controls how quickly the uncertainty decreases as the average rest period increases. In Equation 10, the threshold is a hyperparameter that serves a s a reference point for average rest periods. The threshold in Equation 10 serves as the hyperparameter responsible for regulating the average length of the average rest period.

To assign a confidence score to the determined state of health, the below equation may be used:

$$\text{Confidence Score} = \quad \text{Eq. 12}$$
$$1 - (|\text{predicted } SOH - \text{determined } SOH|) * \text{Uncertainty}$$

Equation 12 determines a confidence score between 0 and 1, where 1 indicates high confidence in the determined value and 0 indicates a minimum level of confidence in the determined value. If the determined state of health (SOH) is equal to the predicted SOH, then the confidence score will be 1.

If the determined value is significantly different from the predicted value, the confidence score will be lower. The magnitude of difference is normalized by the level of uncertainty, so a large uncertainty will result in a lower confidence score for a given difference.

Figure 20:
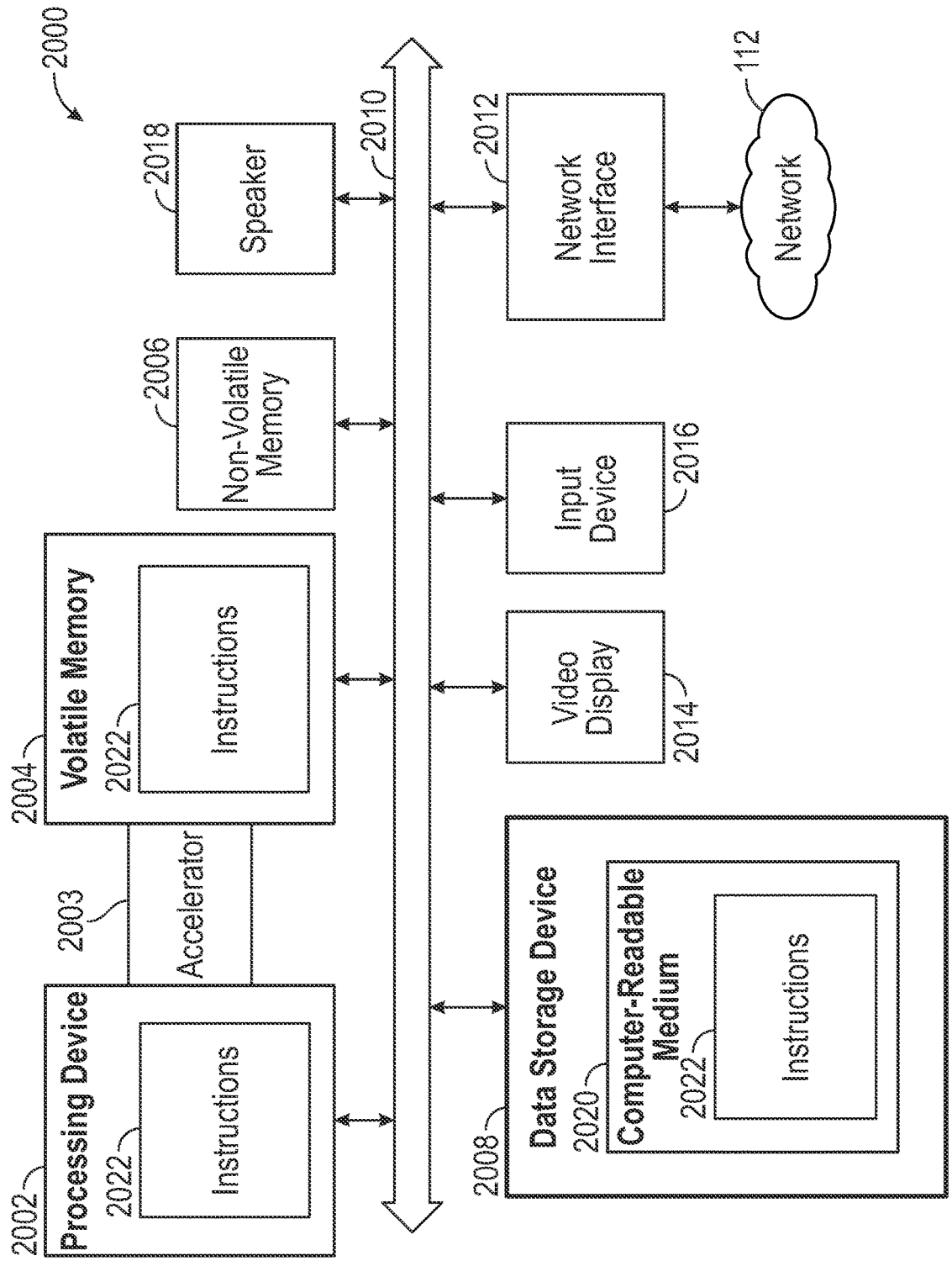
FIG. 20 illustrates an example computer system according to certain embodiments of this disclosure.

FIG. 20 illustrates example computer system 2000 which can perform any one or more of the methods described herein, in accordance with one or more aspects of the present disclosure. In one example, computer system 2000 may correspond to the computing device 102 (e.g., user computing device), one or more servers 128 of the cloud-based computing system 116, the training engine 130, any component of the vehicle 117, or any suitable component of FIG. 1. The computer system 2000 may be capable of executing the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 2000 includes a processing device 2002, a volatile memory 2004 (e.g., random access memory (RAM)), a non-volatile memory 2006 (e.g., read-only memory (ROM), flash memory, solid state drives (SSDs), and a data storage device 2008, the foregoing of which are enabled to communicate with each other via a bus 2010.

Processing device 2002 represents one or more general-purpose processing devices such as a microprocessor, central processing unit, or the like. More particularly, the processing device 2002 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 2002 may also be one or more special-purpose processing devices such as an application specific integrated circuit (ASIC), a system on a chip, a field programmable gate array (FPGA), a digital signal processor (DSP), network processor, or the like. The processing device 2002 may include more than one processing device, and each of the processing devices may be the same or different types. The processing device 2002 may include or be communicatively coupled to one or more accelerators 2003 configured to offload various data-processing tasks from the processing device 2002. The processing device 2002 is configured to execute instructions for performing any of the operations and steps discussed herein.

The computer system 2000 may further include a network interface device 2012. The network interface device 2012 may be configured to communicate data via any suitable communication protocol. In some embodiments, the network interface devices 2012 may enable wireless (e.g., WiFi, Bluetooth, ZigBee, etc.) or wired (e.g., Ethernet, etc.) communications. The computer system 2000 also may include a video display 2014 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 2016 (e.g., a keyboard or a mouse), and one or more speakers 2018 (e.g., a speaker). In one illustrative example, the video display 2014 and the input device(s) 2016 may be combined into a single component or device (e.g., an LCD touch screen).

The output device 2050 may transmit and receive data from a computer system application programming interface (API). The data may pertain to any suitable information described herein, such as a remaining useful life of a battery pack, among other information.

The data storage device 2008 may include a computer-readable medium 2020 on which the instructions 2022 embodying any one or more of the methods, operations, or functions described herein is stored. The instructions 2022 may also reside, completely or at least partially, within the volatile memory 2004 or within the processing device 2002 during execution thereof by the computer system 2000. As such, the volatile memory 2004 and the processing device 2002 also constitute computer-readable media. The instructions 2022 may further be transmitted or received over a network via the network interface device 2012.

While the computer-readable storage medium 2020 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112 (f) unless the exact words "means for" are followed by a participle.

Consistent with the above disclosure, the examples of systems and method enumerated in the following clauses are specifically contemplated and are intended as a non-limiting set of examples.

1. A computer-implemented method comprising:
receiving charge cycle data pertaining to a battery pack;
determining, based on the charge cycle data, whether a noise level of a battery management system exceeds a first threshold;
in response to determining the noise level exceeds the first threshold, determining an initial state of charge of the battery pack using coulomb counting by reversing the charge cycle data;
in response to determining the noise level does not exceed the first threshold, determining whether a rest time before charge cycle exceeds a second threshold; and
in response to determining the rest time before charge cycle does not exceed the second threshold, determining the initial state of charge of the battery pack using coulomb counting by reversing the charge cycle data.

2. The computer-implemented method of any clause herein, further comprising, in response to determining the rest time before charge cycle exceeds the second threshold, determining the initial state of charge of the battery pack by using a state of charge open circuit voltage table.

3. The computer-implemented method of any clause herein, further comprising, based on the charge cycle data and the initial state of charge, simulating a charging cycle using a digital twin battery model.

4. The computer-implemented method of any clause herein, further comprising, based on the simulated charging cycle, determining a state of health of the battery pack.

5. The computer-implemented method of any clause herein, further comprising, based on the simulated charging cycle and an aging dataset, determining a confidence score for the state of health of the battery pack.

6. The computer-implemented method of any clause herein, wherein the aging dataset is generated to include parameters comprising at least one of a number of charge cycles, an average charge rate, an average discharge rate, a total rest period, and an average state of charge during rest.

7. The computer-implemented method of any clause herein, wherein the charge cycle data comprises state of charge, voltage, temperature, current, charging rates, discharging rates, or some combination thereof.

8. The computer-implemented method of any clause herein, wherein the charge cycle data identifies a start and end of one or more charge events for the battery pack, a duration of the one or more charge events, a rest duration of before and after the one or more charge events, or some combination thereof.

9. The computer-implemented method of any clause herein, wherein reversing the charge cycle data comprises using a longer rest duration following a charge cycle to determine the initial state of charge.

10. A system comprising:
a memory device storing instructions; and
a processing device communicatively coupled to the memory device, wherein the processing device executes the instructions to:
receive charge cycle data pertaining to a battery pack;
determine, based on the charge cycle data, whether a noise level of a battery management system exceeds a first threshold;
in response to determining the noise level exceeds the first threshold, determine an initial state of charge of the battery pack using coulomb counting by reversing the charge cycle data;
in response to determining the noise level does not exceed the first threshold, determine whether a rest time before charge cycle exceeds a second threshold; and
in response to determining the rest time before charge cycle does not exceed the second threshold, determine the initial state of charge of the battery pack using coulomb counting by reversing the charge cycle data.

11. The system of any clause herein, wherein, in response to determining the rest time before charge cycle exceeds the second threshold, the processing device is further to determine the initial state of charge of the battery pack by using a state of charge open circuit voltage table.

12. The system of any clause herein, wherein, based on the charge cycle data and the initial state of charge, the processing device is further to simulate a charging cycle using a digital twin battery model.

13. The system of any clause herein, wherein, based on the simulated charging cycle, the processing device is further to determine a state of health of the battery pack.

14. The system of any clause herein, wherein, based on the simulated charging cycle and an aging dataset, the processing device is further to determine a confidence score for the state of health of the battery pack.

15. The system of any clause herein, wherein the aging dataset is generated to include parameters comprising at least one of a number of charge cycles, an average charge rate, an average discharge rate, a total rest period, and an average state of charge during rest.

16. The system of any clause herein, wherein the charge cycle data comprises state of charge, voltage, temperature, current, charging rates, discharging rates, or some combination thereof.

17. The system of any clause herein, wherein the charge cycle data identifies a start and end of one or more charge events for the battery pack, a duration of the one or more charge events, a rest duration of before and after the one or more charge events, or some combination thereof.

18. The system of any clause herein, wherein reversing the charge cycle data comprises using a longer rest duration following a charge cycle to determine the initial state of charge.

19. A tangible, non-transitory computer-readable medium storing instructions that, when executed, cause a processing device to:
receive charge cycle data pertaining to a battery pack;
determine, based on the charge cycle data, whether a noise level of a battery management system exceeds a first threshold;
in response to determining the noise level exceeds the first threshold, determine an initial state of charge of the battery pack using coulomb counting by reversing the charge cycle data;

in response to determining the noise level does not exceed the first threshold, determine whether a rest time before charge cycle exceeds a second threshold; and in response to determining the rest time before charge cycle does not exceed the second threshold, determine the initial state of charge of the battery pack using coulomb counting by reversing the charge cycle data.

20. The computer-readable medium of any clause herein, wherein reversing the charge cycle data comprises using a longer rest duration following a charge cycle to determine the initial state of charge.

21. The computer-readable medium of any clause herein, wherein, in response to determining the rest time before charge cycle exceeds the second threshold, the processing device is further to determine the initial state of charge of the battery pack by using a state of charge open circuit voltage table.

22. The computer-readable medium of any clause herein, wherein, based on the charge cycle data and the initial state of charge, the processing device is further to simulate a charging cycle using a digital twin battery model.

23. The computer-readable medium of any clause herein, wherein, based on the simulated charging cycle, the processing device is further to determine a state of health of the battery pack.

24. The computer-readable medium of any clause herein, wherein, based on the simulated charging cycle and an aging dataset, the processing device is further to determine a confidence score for the state of health of the battery pack.

25. The computer-readable medium of any clause herein, wherein the aging dataset is generated to include parameters comprising at least one of a number of charge cycles, an average charge rate, an average discharge rate, a total rest period, and an average state of charge during rest.

26. The computer-readable medium of any clause herein, wherein the charge cycle data comprises state of charge, voltage, temperature, current, charging rates, discharging rates, or some combination thereof.

27. The computer-readable medium of any clause herein, wherein the charge cycle data identifies a start and end of one or more charge events for the battery pack, a duration of the one or more charge events, a rest duration of before and after the one or more charge events, or some combination thereof.

28. The computer-readable medium of any clause herein, wherein reversing the charge cycle data comprises using a longer rest duration following a charge cycle to determine the initial state of charge.

29. A device comprising:
a memory device storing instructions; and
a processing device communicatively coupled to the memory device, wherein the processing device executes the instructions:
receive charge cycle data pertaining to a battery pack;
determine, based on the charge cycle data, whether a noise level of a battery management system exceeds a first threshold;
in response to determining the noise level exceeds the first threshold, determine an initial state of charge of the battery pack using coulomb counting by reversing the charge cycle data;
in response to determining the noise level does not exceed the first threshold, determine whether a rest time before charge cycle exceeds a second threshold; and
in response to determining the rest time before charge cycle does not exceed the second threshold, determine the initial state of charge of the battery pack using coulomb counting by reversing the charge cycle data.

30. The device of any clause herein, wherein reversing the charge cycle data comprises using a longer rest duration following a charge cycle to determine the initial state of charge.

31. A computer-implemented method comprising:
based on at least a received first state of health of a battery pack and an initial state of charge of the battery pack, determining, by a state of charge estimator of a digital twin battery model, one or more states of charges for the battery pack;
based on the one or more states of charges for the battery pack, determining, by a voltage predictor of the digital twin battery model, one or more predicted battery voltages;
based on the one or more predicted battery voltages, determining, by a state of charge corrector of the digital twin battery model, a voltage difference between the one or more predicted battery voltages and one or more measured voltages; and
based on the voltage difference, correcting, by the state of charge corrector, the one or more states of charges to generate one or more corrected states of charges for the battery pack.

32. The computer-implemented method of any clause herein, further comprising determining, by the state of charge corrector, an accumulation of Ampere-hours based on current flow and a time duration of the current flow.

33. The computer-implemented method of any clause herein, further comprising, based on the accumulation of Ampere-hours and the one or more corrected states of charges for the battery pack, determining a second state of health of the battery pack.

34 The computer-implemented method of any clause herein, further comprising determining, by a confidence score calculator, a confidence score for the second state of health of the battery pack.

35. The computer-implemented method of any clause herein, further comprising determining, by the state of charge corrector, a rest duration before charging cycle as a time interval between an end of discharging the battery pack and a start of charging the battery pack.

36. The computer-implemented method of any clause herein, further comprising determining, by the state of charge corrector, a rest duration after charging cycle as a time interval between an end of charging the battery pack and a time when the battery pack is subsequently used.

37. The computer-implemented method of any clause herein, wherein, to determine the one or more predicted battery voltages, the voltage predictor further uses resistance and capacitance parameters of the battery pack, a measured current of the battery pack, and a state of charge-open circuit voltage curve.

38. The computer-implemented method of any clause herein, wherein the digital twin battery model is executed by a cloud-based system.

39. A system comprising:
a memory device storing instructions; and
a processing device communicatively coupled to the memory device, wherein the processing device executes the instructions to:
based on at least a received first state of health of a battery pack and an initial state of charge of the battery pack, determine, by a state of charge estimator of a digital twin battery model, one or more states of charges for the battery pack;

based on the one or more states of charges for the battery pack, determine, by a voltage predictor of the digital twin battery model, one or more predicted battery voltages;

based on the one or more predicted battery voltages, determine, by a state of charge corrector of the digital twin battery model, a voltage difference between the one or more predicted battery voltages and one or more measured voltages; and based on the voltage difference, correct, by the state of charge corrector, the one or more states of charges to generate one or more corrected states of charges for the battery pack.

40. The system of any clause herein, wherein the processing device is further to determine, by the state of charge corrector, an accumulation of Ampere-hours based on current flow and a time duration of the current flow.

41. The system of any clause herein, wherein, based on the accumulation of Ampere-hours and the one or more corrected states of charges for the battery pack, the processing device is further to determine a second state of health of the battery pack.

42. The system of any clause herein, wherein the processing device is further to determine, by a confidence score calculator, a confidence score for the second state of health of the battery pack.

43. The system of any clause herein, wherein the processing device is further to determine, by the state of charge corrector, a rest duration before charging cycle as a time interval between an end of discharging the battery pack and a start of charging the battery pack.

44. The system of any clause herein, wherein the processing device is further to determine, by the state of charge corrector, a rest duration after charging cycle as a time interval between an end of charging the battery pack and a time when the battery pack is subsequently used.

45. The system of any clause herein, wherein, to determine the one or more predicted battery voltages, the voltage predictor further uses resistance and capacitance parameters of the battery pack, a measured current of the battery pack, and a state of charge-open circuit voltage curve.

46. The system of any clause herein, wherein the digital twin battery model is executed by a cloud-based system.

47. A tangible, non-transitory computer-readable medium storing instructions that, when executed, cause a processing device to:

based on at least a received first state of health of a battery pack and an initial state of charge of the battery pack, determine, by a state of charge estimator of a digital twin battery model, one or more states of charges for the battery pack;

based on the one or more states of charges for the battery pack, determine, by a voltage predictor of the digital twin battery model, one or more predicted battery voltages;

based on the one or more predicted battery voltages, determine, by a state of charge corrector of the digital twin battery model, a voltage difference between the one or more predicted battery voltages and one or more measured voltages; and based on the voltage difference, correct, by the state of charge corrector, the one or more states of charges to generate one or more corrected states of charges for the battery pack.

48. The computer-readable medium of any clause herein, wherein the processing device is further to determine, by the state of charge corrector, an accumulation of Ampere-hours based on current flow and a time duration of the current flow.

49. The computer-readable medium of any clause herein, wherein, based on the accumulation of Ampere-hours and the one or more corrected states of charges for the battery pack, the processing device is further to determine a second state of health of the battery pack.

50. The computer-readable medium of any clause herein, wherein the processing device is further to determine, by a confidence score calculator, a confidence score for the second state of health of the battery pack.

51. The computer-readable medium of any clause herein, wherein the processing device is further to determine, by the state of charge corrector, a rest duration before charging cycle as a time interval between an end of discharging the battery pack and a start of charging the battery pack.

52. The computer-readable medium of any clause herein, wherein the processing device is further to determine, by the state of charge corrector, a rest duration after charging cycle as a time interval between an end of charging the battery pack and a time when the battery pack is subsequently used.

53. The computer-readable medium of any clause herein, wherein, to determine the one or more predicted battery voltages, the voltage predictor further uses resistance and capacitance parameters of the battery pack, a measured current of the battery pack, and a state of charge-open circuit voltage curve.

54. The computer-readable medium of any clause herein, wherein the digital twin battery model is executed by a cloud-based system.

55. A device comprising:
a memory device storing instructions; and
a processing device communicatively coupled to the memory device, wherein the processing device executes the instructions to:

based on at least a received first state of health of a battery pack and an initial state of charge of the battery pack, determine, by a state of charge estimator of a digital twin battery model, one or more states of charges for the battery pack;

based on the one or more states of charges for the battery pack, determine, by a voltage predictor of the digital twin battery model, one or more predicted battery voltages;

based on the one or more predicted battery voltages, determine, by a state of charge corrector of the digital twin battery model, a voltage difference between the one or more predicted battery voltages and one or more measured voltages; and based on the voltage difference, correct, by the state of charge corrector, the one or more states of charges to generate one or more corrected states of charges for the battery pack.

56 The device of any clause herein, wherein the processing device is further to determine, by the state of charge corrector, an accumulation of Ampere-hours based on current flow and a time duration of the current flow.

57. The device of any clause herein, wherein, based on the accumulation of Ampere-hours and the one or more corrected states of charges for the battery pack, the processing device is further to determine a second state of health of the battery pack.

58. The device of any clause herein, wherein the processing device is further to determine, by a confidence score calculator, a confidence score for the second state of health of the battery pack.

59. The device of any clause herein, wherein the processing device is further to determine, by the state of charge corrector, a rest duration before charging cycle as a time interval between an end of discharging the battery pack and a start of charging the battery pack.

60. The device of any clause herein, wherein the processing device is further to determine, by the state of charge corrector, a rest duration after charging cycle as a time interval between an end of charging the battery pack and a time when the battery pack is subsequently used.

61. A computer-implemented method comprising:
generating an aging battery dataset comprising information pertaining to one or more age histories of electric vehicles, one or more cell manufacturer specifications, and one or more laboratory tests;
based on the information and one or more battery health metrics associated with one or more battery pack modules, predicting a first state of health of the one or more battery pack modules;
receiving a second state of health of the one or more battery pack modules, wherein the second state of health is determined based at least on one or more determined states of charges for the one or more battery pack modules;
determining an uncertainty for the second state of health using at least a rest duration after charging of the one or more battery pack modules and a rest duration before charging of the one or more battery pack modules; and
based on the uncertainty, the first state of health, and the second state of health, determining a confidence score for the second state of health of the one or more battery pack modules.

62. The computer-implemented method of any clause herein, further comprising, based on the confidence score of the state of health of the one or more battery pack modules, managing one or more parameters of the one or more battery pack modules.

63. The computer-implemented method of any clause herein, wherein the second state of health of the one or more battery pack modules is further determined based on a voltage difference between one or more predicted battery voltages and one or more measured voltages of the one or more battery pack modules.

64. The computer-implemented method of any clause herein, wherein the first state of health is predicted based on a number of charge cycles, an average discharge rate, an average charge rate, a rest period duration, and an average state of charge value during rest period of the electric vehicles.

65. The computer-implemented method of any clause herein, wherein the one or more laboratory tests comprise cyclic aging tests and calendar aging tests that subject battery cells to controlled conditions of temperature, humidity, and cycling to simulate an aging process.

66. The computer-implemented method of any clause herein, wherein the one or more cell manufacturer specifications comprise a nominal capacity of one or more battery cells, a nominal voltage of the one or more battery cells, or some combination thereof.

67. The computer-implemented method of any clause herein, wherein the second state of health of the one or more battery pack modules is further determined based on an Ampere-hours accumulated value.

68. A system comprising:
a memory device storing instructions;
a processing device communicatively coupled to the memory device, wherein the processing device executes the instructions to:
generate an aging battery dataset comprising information pertaining to one or more age histories of electric vehicles, one or more cell manufacturer specifications, and one or more laboratory tests;
based on the information and one or more battery health metrics associated with one or more battery pack modules, predict a first state of health of the one or more battery pack modules;
receive a second state of health of the one or more battery pack modules, wherein the second state of health is determined based at least on one or more determined states of charges for the one or more battery pack modules;
determine an uncertainty for the second state of health using at least a rest duration after charging of the one or more battery pack modules and a rest duration before charging of the one or more battery pack modules; and
based on the uncertainty, the first state of health, and the second state of health, determine a confidence score for the second state of health of the one or more battery pack modules.

69. The system of any clause herein, further comprising, based on the confidence score of the state of health of the one or more battery pack modules, managing one or more parameters of the one or more battery pack modules.

70. The system of any clause herein, wherein the second state of health of the one or more battery pack modules is further determined based on a voltage difference between one or more predicted battery voltages and one or more measured voltages of the one or more battery pack modules.

71. The system of any clause herein, wherein the first state of health is predicted based on a number of charge cycles, an average discharge rate, an average charge rate, a rest period duration, and an average state of charge value during rest period of the electric vehicles.

72. The system of any clause herein, wherein the one or more laboratory tests comprise cyclic aging tests and calendar aging tests that subject battery cells to controlled conditions of temperature, humidity, and cycling to simulate an aging process.

73. The system of any clause herein, wherein the one or more cell manufacturer specifications comprise a nominal capacity of one or more battery cells, a nominal voltage of the one or more battery cells, or some combination thereof.

74. The system of any clause herein, wherein the second state of health of the one or more battery pack modules is further determined based on an Ampere-hours accumulated value.

75. A tangible, non-transitory computer-readable medium storing instructions that, when executed, cause a processing device to:
generate an aging battery dataset comprising information pertaining to one or more age histories of electric vehicles, one or more cell manufacturer specifications, and one or more laboratory tests;
based on the information and one or more battery health metrics associated with one or more battery pack modules, predict a first state of health of the one or more battery pack modules;
receive a second state of health of the one or more battery pack modules, wherein the second state of health is determined based at least on one or more determined states of charges for the one or more battery pack modules;

determine an uncertainty for the second state of health using at least a rest duration after charging of the one or more battery pack modules and a rest duration before charging of the one or more battery pack modules; and based on the uncertainty, the first state of health, and the second state of health, determine a confidence score for the second state of health of the one or more battery pack modules.

76. The computer-readable medium of any clause herein, wherein, based on the confidence score of the state of health of the one or more battery pack modules, the processing device to manage one or more parameters of the one or more battery pack modules.

77. The computer-readable medium of any clause herein, wherein the second state of health of the one or more battery pack modules is further determined based on a voltage difference between one or more predicted battery voltages and one or more measured voltages of the one or more battery pack modules.

78. The computer-readable medium of any clause herein, wherein the first state of health is predicted based on a number of charge cycles, an average discharge rate, an average charge rate, a rest period duration, and an average state of charge value during rest period of the electric vehicles.

79. The computer-readable medium of any clause herein, wherein the one or more laboratory tests comprise cyclic aging tests and calendar aging tests that subject battery cells to controlled conditions of temperature, humidity, and cycling to simulate an aging process.

80. The computer-readable medium of any clause herein, wherein the one or more cell manufacturer specifications comprise a nominal capacity of one or more battery cells, a nominal voltage of the one or more battery cells, or some combination thereof.

81. The computer-readable medium of any clause herein, wherein the second state of health of the one or more battery pack modules is further determined based on an Ampere-hours accumulated value.

82. A device comprising:
a memory device storing instructions;
a processing device communicatively coupled to the memory device, wherein the processing device executes the instructions to:
generate an aging battery dataset comprising information pertaining to one or more age histories of electric vehicles, one or more cell manufacturer specifications, and one or more laboratory tests;
based on the information and one or more battery health metrics associated with one or more battery pack modules, predict a first state of health of the one or more battery pack modules;
receive a second state of health of the one or more battery pack modules, wherein the second state of health is determined based at least on one or more determined states of charges for the one or more battery pack modules;
determine an uncertainty for the second state of health using at least a rest duration after charging of the one or more battery pack modules and a rest duration before charging of the one or more battery pack modules; and based on the uncertainty, the first state of health, and the second state of health, determine a confidence score for the second state of health of the one or more battery pack modules.

83. The device of any clause herein, further comprising, based on the confidence score of the state of health of the one or more battery pack modules, managing one or more parameters of the one or more battery pack modules.

84. The device of any clause herein, wherein the second state of health of the one or more battery pack modules is further determined based on a voltage difference between one or more predicted battery voltages and one or more measured voltages of the one or more battery pack modules.

85. The device of any clause herein, wherein the first state of health is predicted based on a number of charge cycles, an average discharge rate, an average charge rate, a rest period duration, and an average state of charge value during rest period of the electric vehicles.

86. The device of any clause herein, wherein the one or more laboratory tests comprise cyclic aging tests and calendar aging tests that subject battery cells to controlled conditions of temperature, humidity, and cycling to simulate an aging process.

87. The device of any clause herein, wherein the one or more cell manufacturer specifications comprise a nominal capacity of one or more battery cells, a nominal voltage of the one or more battery cells, or some combination thereof.

88. The device of any clause herein, wherein the second state of health of the one or more battery pack modules is further determined based on an Ampere-hours accumulated value.

89. The device of any clause herein, wherein the one or more battery pack modules are included in an electric vehicle.

90. The device of any clause herein, further comprising, based on the confidence score of the state of health of the one or more battery pack modules, controlling the one or more battery pack modules.

What is claimed is:
1. A computer-implemented method comprising:
based on at least a received first state of health of a battery pack and an initial state of charge of the battery pack, determining, by a state of charge estimator of a digital twin battery model, one or more states of charges for the battery pack, wherein the initial state of charge is determined using coulomb counting by reversing charge cycle data such that a rest period before a charging cycle is changed to be longer than a rest period after the charging cycle on a current graph;
based on the one or more states of charges for the battery pack, determining, by a voltage predictor of the digital twin battery model, one or more predicted battery voltages;
based on the one or more predicted battery voltages, determining, by a state of charge corrector of the digital twin battery model, a voltage difference between the one or more predicted battery voltages and one or more measured voltages;
based on the voltage difference, correcting, by the state of charge corrector, the one or more states of charges to generate one or more corrected states of charges for the battery pack; and
based at least on the one or more corrected states of charges for the battery pack, determining a second state of health of the battery pack; and
based at least on the second state of health of the battery pack, controlling operation of the battery pack by modifying an operating parameter of a vehicle associated with the battery pack such that the vehicle consumes less energy from the battery pack.

2. The computer-implemented method of claim 1, further comprising determining, by the state of charge corrector, an accumulation of Ampere-hours based on current flow and a time duration of the current flow.

3. The computer-implemented method of claim 2, further comprising, based on the accumulation of Ampere-hours and the one or more corrected states of charges for the battery pack, determining the second state of health of the battery pack.

4. The computer-implemented method of claim 3, further comprising determining, by a confidence score calculator, a confidence score for the second state of health of the battery pack.

5. The computer-implemented method of claim 1, further comprising determining, by the state of charge corrector, a rest duration before charging cycle as a time interval between an end of discharging the battery pack and a start of charging the battery pack.

6. The computer-implemented method of claim 1, further comprising determining, by the state of charge corrector, a rest duration after charging cycle as a time interval between an end of charging the battery pack and a time when the battery pack is subsequently used.

7. The computer-implemented method of claim 1, wherein, to determine the one or more predicted battery voltages, the voltage predictor further uses resistance and capacitance parameters of the battery pack, a measured current of the battery pack, and a state of charge-open circuit voltage curve.

8. The computer-implemented method of claim 1, wherein the digital twin battery model is executed by a cloud-based system.

9. A system comprising:
a memory device storing instructions; and
a processing device communicatively coupled to the memory device, wherein the processing device executes the instructions to:
based on at least a received first state of health of a battery pack and an initial state of charge of the battery pack, determine, by a state of charge estimator of a digital twin battery model, one or more states of charges for the battery pack, wherein the initial state of charge is determined using coulomb counting by reversing charge cycle data such that a rest period before a charging cycle is changed to be longer than a rest period after the charging cycle on a current graph;
based on the one or more states of charges for the battery pack, determine, by a voltage predictor of the digital twin battery model, one or more predicted battery voltages;
based on the one or more predicted battery voltages, determine, by a state of charge corrector of the digital twin battery model, a voltage difference between the one or more predicted battery voltages and one or more measured voltages;
based on the voltage difference, correct, by the state of charge corrector, the one or more states of charges to generate one or more corrected states of charges for the battery pack; and
based at least on the one or more corrected states of charges for the battery pack, determining a second state of health of the battery pack; and
based at least on the second state of health of the battery pack, control operation of the battery pack by modifying an operating parameter of a vehicle associated with the battery pack such that the vehicle consumes less energy from the battery pack.

10. The system of claim 9, wherein the processing device is further to determine, by the state of charge corrector, an accumulation of Ampere-hours based on current flow and a time duration of the current flow.

11. The system of claim 10, wherein, based on the accumulation of Ampere-hours and the one or more corrected states of charges for the battery pack, the processing device is further to determine the second state of health of the battery pack.

12. The system of claim 11, wherein the processing device is further to determine, by a confidence score calculator, a confidence score for the second state of health of the battery pack.

13. The system of claim 9, wherein the processing device is further to determine, by the state of charge corrector, a rest duration before charging cycle as a time interval between an end of discharging the battery pack and a start of charging the battery pack.

14. The system of claim 9, wherein the processing device is further to determine, by the state of charge corrector, a rest duration after charging cycle as a time interval between an end of charging the battery pack and a time when the battery pack is subsequently used.

15. The system of claim 9, wherein, to determine the one or more predicted battery voltages, the voltage predictor further uses resistance and capacitance parameters of the battery pack, a measured current of the battery pack, and a state of charge-open circuit voltage curve.

16. The system of claim 9, wherein the digital twin battery model is executed by a cloud-based system.

17. A tangible, non-transitory computer-readable medium storing instructions that, when executed, cause a processing device to:
based on at least a received first state of health of a battery pack and an initial state of charge of the battery pack, determine, by a state of charge estimator of a digital twin battery model, one or more states of charges for the battery pack, wherein the initial state of charge is determined using coulomb counting by reversing charge cycle data such that a rest period before a charging cycle is changed to be longer than a rest period after the charging cycle on a current graph;
based on the one or more states of charges for the battery pack, determine, by a voltage predictor of the digital twin battery model, one or more predicted battery voltages;
based on the one or more predicted battery voltages, determine, by a state of charge corrector of the digital twin battery model, a voltage difference between the one or more predicted battery voltages and one or more measured voltages;
based on the voltage difference, correct, by the state of charge corrector, the one or more states of charges to generate one or more corrected states of charges for the battery pack; and
based at least on the one or more corrected states of charges for the battery pack, determining a second state of health of the battery pack; and
based at least on the second state of health of the battery pack, control operation of the battery pack by modifying an operating parameter of a vehicle associated with the battery pack such that the vehicle consumes less energy from the battery pack.

18. The computer-readable medium of claim 17, wherein the processing device is further to determine, by the state of charge corrector, an accumulation of Ampere-hours based on current flow and a time duration of the current flow.

19. The computer-readable medium of claim 18, wherein, based on the accumulation of Ampere-hours and the one or more corrected states of charges for the battery pack, the processing device is further to determine the second state of health of the battery pack.

20. The computer-readable medium of claim 19, wherein the processing device is further to determine, by a confidence score calculator, a confidence score for the second state of health of the battery pack.

21. The computer-readable medium of claim 17, wherein the processing device is further to determine, by the state of charge corrector, a rest duration before charging cycle as a time interval between an end of discharging the battery pack and a start of charging the battery pack.

22. The computer-readable medium of claim 17, wherein the processing device is further to determine, by the state of charge corrector, a rest duration after charging cycle as a time interval between an end of charging the battery pack and a time when the battery pack is subsequently used.

23. The computer-readable medium of claim 17, wherein, to determine the one or more predicted battery voltages, the voltage predictor further uses resistance and capacitance parameters of the battery pack, a measured current of the battery pack, and a state of charge-open circuit voltage curve.

24. The computer-readable medium of claim 17, wherein the digital twin battery model is executed by a cloud-based system.

25. A device comprising:
a memory device storing instructions; and
a processing device communicatively coupled to the memory device, wherein the processing device executes the instructions to:
based on at least a received first state of health of a battery pack and an initial state of charge of the battery pack, determine, by a state of charge estimator of a digital twin battery model, one or more states of charges for the battery pack, wherein the initial state of charge is determined using coulomb counting by reversing charge cycle data such that a rest period before a charging cycle is changed to be longer than a rest period after the charging cycle on a current graph;
based on the one or more states of charges for the battery pack, determine, by a voltage predictor of the digital twin battery model, one or more predicted battery voltages;
based on the one or more predicted battery voltages, determine, by a state of charge corrector of the digital twin battery model, a voltage difference between the one or more predicted battery voltages and one or more measured voltages;
based on the voltage difference, correct, by the state of charge corrector, the one or more states of charges to generate one or more corrected states of charges for the battery pack; and
based at least on the one or more corrected states of charges for the battery pack, determining a second state of health of the battery pack; and
based at least on the second state of health of the battery pack, control operation of the battery pack by modifying an operating parameter of a vehicle associated with the battery pack such that the vehicle consumes less energy from the battery pack.

26. The device of claim 25, wherein the processing device is further to determine, by the state of charge corrector, an accumulation of Ampere-hours based on current flow and a time duration of the current flow.

27. The device of claim 26, wherein, based on the accumulation of Ampere-hours and the one or more corrected states of charges for the battery pack, the processing device is further to determine the second state of health of the battery pack.

28. The device of claim 27, wherein the processing device is further to determine, by a confidence score calculator, a confidence score for the second state of health of the battery pack.

29. The device of claim 25, wherein the processing device is further to determine, by the state of charge corrector, a rest duration before charging cycle as a time interval between an end of discharging the battery pack and a start of charging the battery pack.

30. The device of claim 25, wherein the processing device is further to determine, by the state of charge corrector, a rest duration after charging cycle as a time interval between an end of charging the battery pack and a time when the battery pack is subsequently used.

* * * * *